(12) United States Patent
Huang et al.

(10) Patent No.: US 12,142,532 B2
(45) Date of Patent: Nov. 12, 2024

(54) INTERCONNECT STRUCTURES FOR SEMICONDUCTOR DEVICES AND METHODS OF MANUFACTURING THE SAME

(71) Applicant: Taiwan Semiconductor Manufacturing Company Limited, Hsinchu (TW)

(72) Inventors: Yu-Lien Huang, Jhubei (TW); Ching-Feng Fu, Taichung (TW); Huan-Just Lin, Hsinchu (TW); Che-Ming Hsu, Hsinchu (TW)

(73) Assignee: TAIWAN SEMICONDUCTOR MANUFACTURING COMPANY, LIMITED, Hsinchu (TW)

( * ) Notice: Subject to any disclaimer, the term of this patent is extended or adjusted under 35 U.S.C. 154(b) by 0 days.

(21) Appl. No.: 18/188,710

(22) Filed: Mar. 23, 2023

(65) Prior Publication Data

US 2023/0230884 A1 Jul. 20, 2023

Related U.S. Application Data

(62) Division of application No. 17/166,548, filed on Feb. 3, 2021, now Pat. No. 11,626,326.

(Continued)

(51) Int. Cl.
*H01L 29/76* (2006.01)
*H01L 21/8234* (2006.01)
(Continued)

(52) U.S. Cl.
CPC ............ *H01L 21/823475* (2013.01); *H01L 21/823481* (2013.01); *H01L 27/0886* (2013.01); *H01L 29/41791* (2013.01)

(58) Field of Classification Search
CPC ..... H01L 21/823475; H01L 21/823481; H01L 27/0886; H01L 29/41791;
(Continued)

(56) References Cited

U.S. PATENT DOCUMENTS 10,050,149 B1 8/2018 Huang et al.
2016/0365426 A1* 12/2016 Ching ............... H01L 29/6653
2017/0125543 A1 5/2017 Greene et al.

FOREIGN PATENT DOCUMENTS

CN 101599455 A 12/2009
CN 109087888 A 12/2018
(Continued)

OTHER PUBLICATIONS

Non-Final Office Action on U.S. Appl. No. 17/166,548 dtd Jul. 29, 2022.

(Continued)

*Primary Examiner* — Theresa T Doan
(74) *Attorney, Agent, or Firm* — FOLEY & LARDNER LLP

(57) ABSTRACT

A semiconductor device includes a first source/drain structure coupled to an end of a first conduction channel that extends along a first direction. The semiconductor device includes a second source/drain structure coupled to an end of a second conduction channel that extends along the first direction. The semiconductor device includes a first interconnect structure extending through an interlayer dielectric and electrically coupled to the first source/drain structure. The semiconductor device includes a second interconnect structure extending through the interlayer dielectric and electrically coupled to the second source/drain structure. The semiconductor device includes a first isolation structure disposed between the first and second source/drain structures and extending into the interlayer dielectric.

20 Claims, 42 Drawing Sheets

Related U.S. Application Data

(60) Provisional application No. 63/016,608, filed on Apr. 28, 2020.

(51) Int. Cl.
 *H01L 27/088* (2006.01)
 *H01L 29/417* (2006.01)
 *H01L 29/94* (2006.01)

(58) Field of Classification Search
 CPC ..... H01L 21/823431; H01L 21/823418; H01L 27/088; H01L 29/785; H01L 21/76805; H01L 21/76895; H01L 23/481; H01L 29/0653; H01L 29/66795; H01L 2029/7858
 USPC ........................................................ 257/401
 See application file for complete search history.

(56) References Cited

FOREIGN PATENT DOCUMENTS

| | | |
|---|---|---|
| CN | 110943044 A | 3/2020 |
| TW | 202013742 A | 4/2020 |

OTHER PUBLICATIONS

Notice of Allowance on U.S. Appl. No. 17/166,548 dtd Dec. 8, 2022.

Office Action on TW Appl. Ser. No. 110114329 dated Aug. 18, 2021 (4 pages).

Office Action issued in connection with Chinese Appl. No. 202110457684.8 dated Sep. 4, 2024.

* cited by examiner

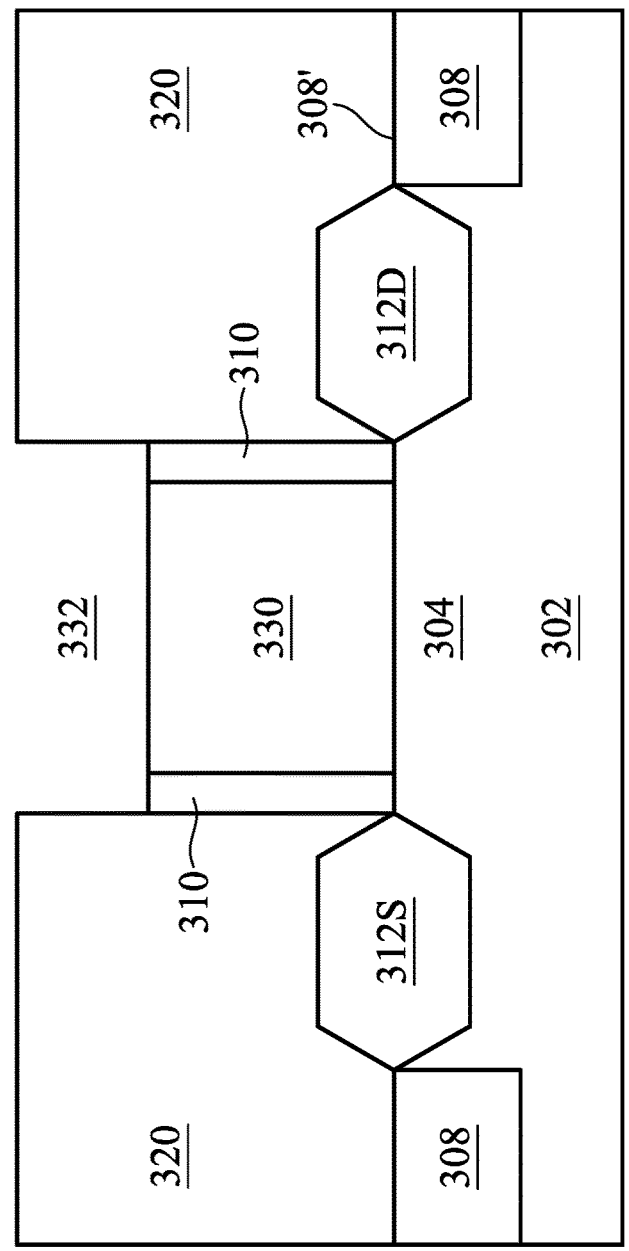

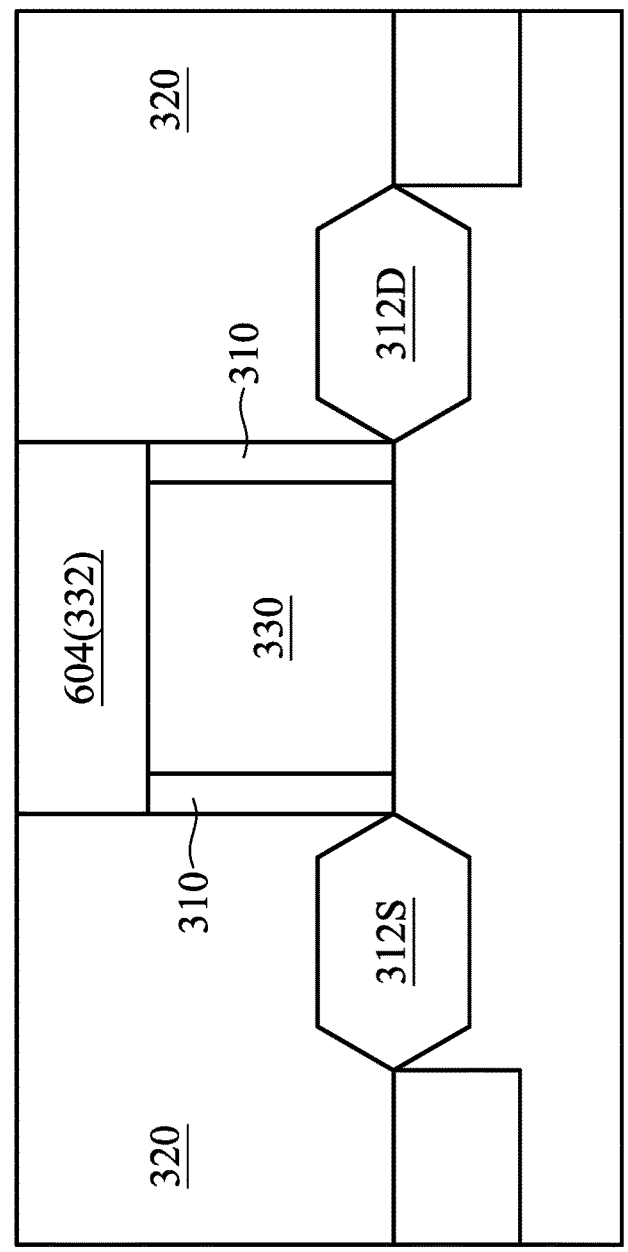

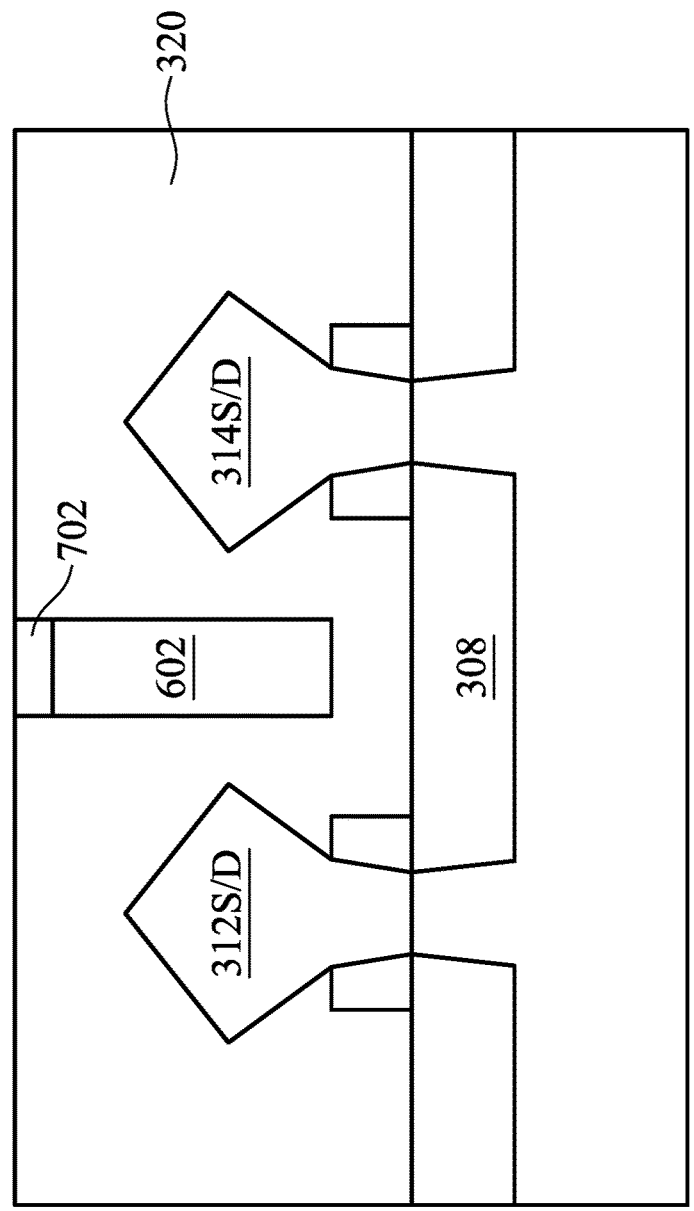

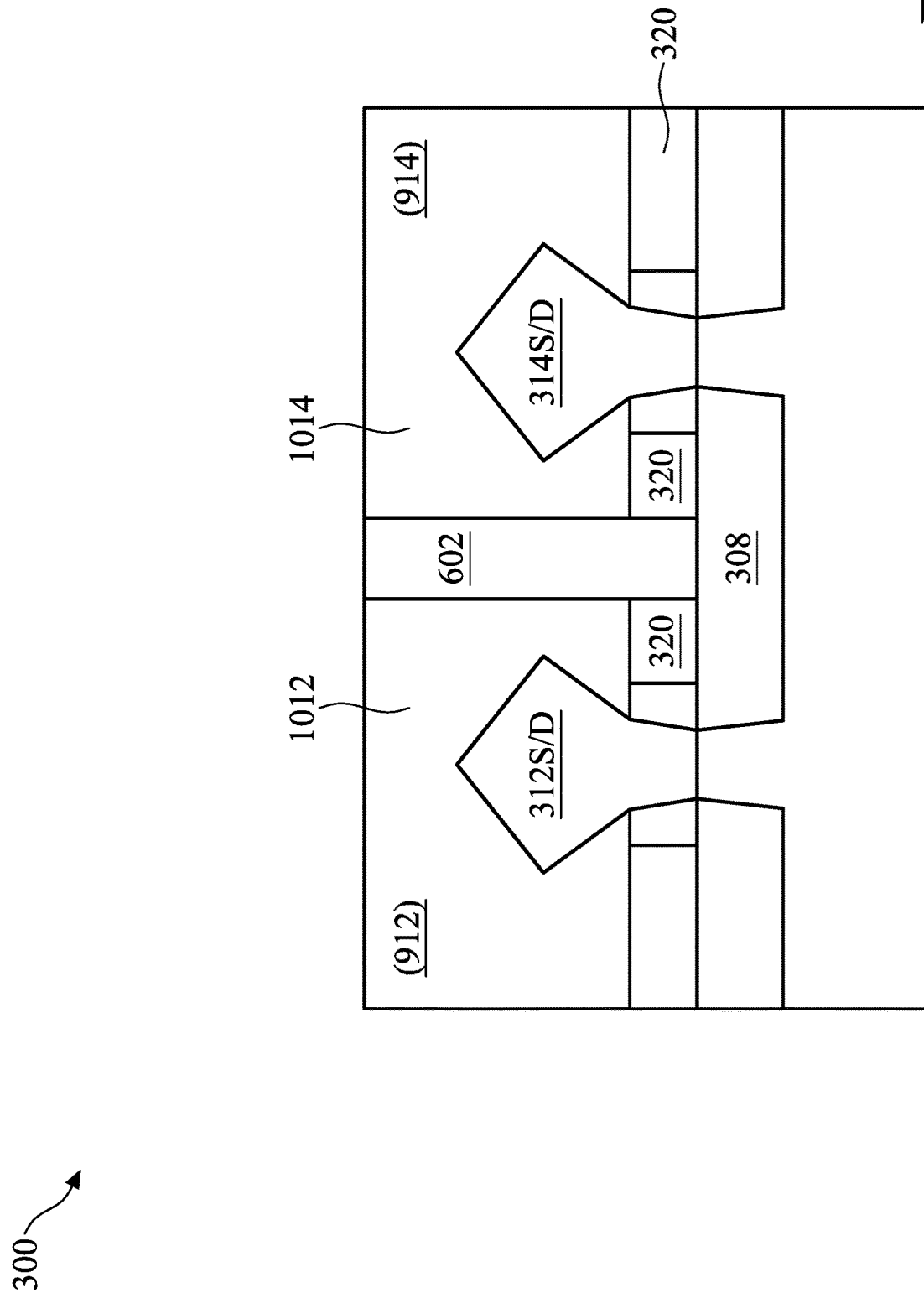

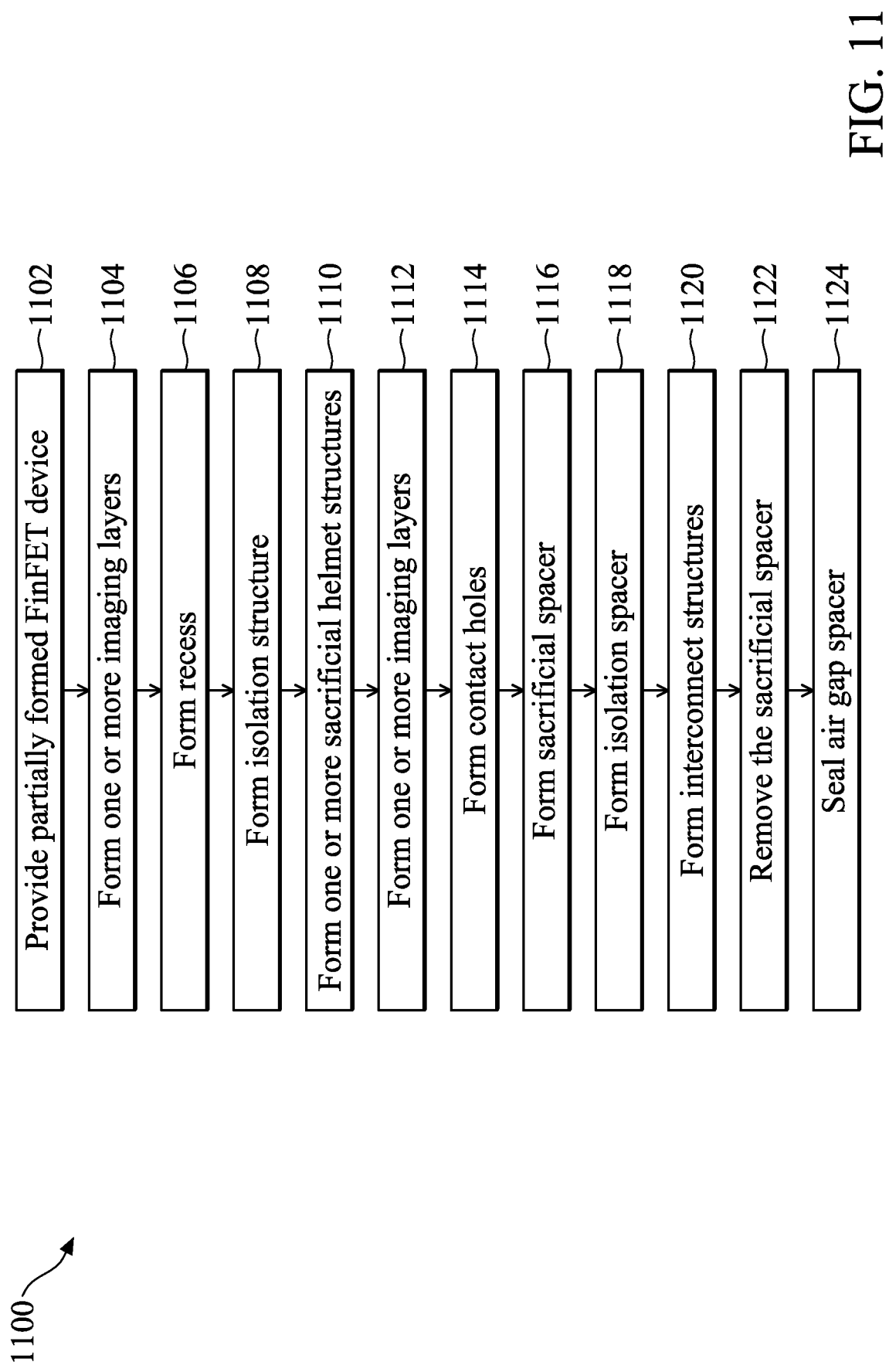

INTERCONNECT STRUCTURES FOR SEMICONDUCTOR DEVICES AND METHODS OF MANUFACTURING THE SAME

CROSS-REFERENCE TO RELATED APPLICATIONS

This application is a divisional application of U.S. application Ser. No. 17/166,548, filed Feb. 3, 2021, which claims the benefit of and priority to U.S. Provisional Application No. 63/016,608, filed on Apr. 28, 2020, which is incorporated by reference herein in its entirety.

BACKGROUND

This disclosure relates generally to a semiconductor device, and in some embodiments, to interconnect structures for a transistor device.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 4A, 4B, 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, and 10D illustrate cross-sectional views of an example FinFET device during various fabrication stages, made by the method of FIG. 2, in accordance with some embodiments.

FIG. 11 illustrates a flow chart of another example method for making interconnect structures for a transistor device, in accordance with some embodiments.

DETAILED DESCRIPTION

Figure 1:
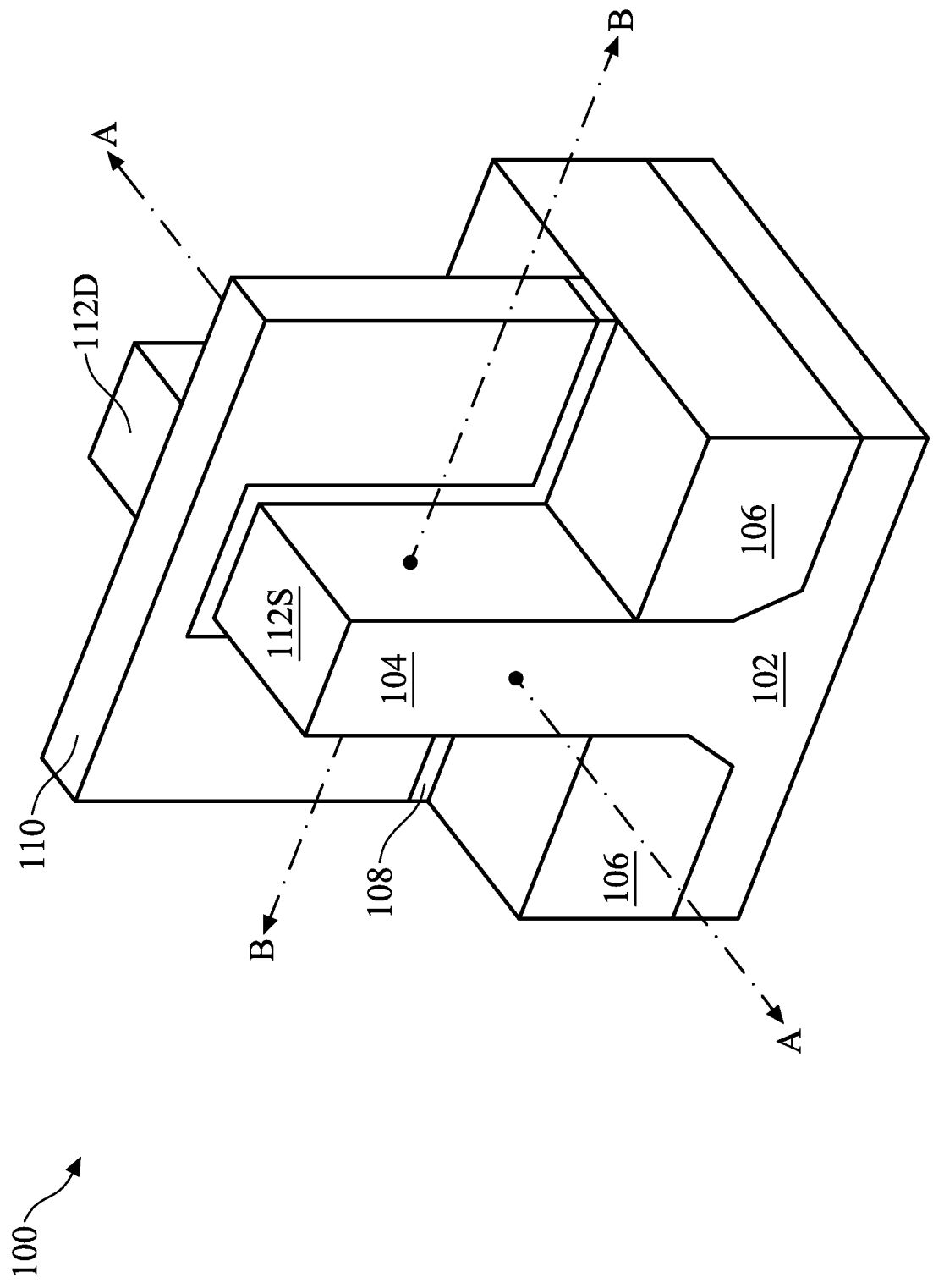
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

IC processing often utilizes a series of patterning processes to produce a number of IC features. For example, existing processing utilizes a patterned structure to define a dielectric spacing between respective interconnect structures for adjacent IC features (e.g., source/drain structures). It is generally desired to have such interconnect structure present a relative greater length (in a direction along which the interconnect structures are aligned), as their respective contact resistances (typically referred to as "$R_c$") can be accordingly reduced. By shrinking a critical dimension of the patterned structure (accordingly a critical dimension of the dielectric spacing), the length of the interconnect structures may be increased. However, in core areas (e.g., static random access memory (SRAM) areas), it has become increasingly challenging to shrink the critical dimension of the dielectric spacing (the patterned structure). For example, the patterned structure, used to defined the dielectric spacing, is typically formed as an island protruded from the workpiece. When the critical dimension of such an island-like structure continues to shrink, it may likely be peeled off or shifted during the patterning process, which adversely impacts formation of the dielectric spacing.

The present disclosure provides various embodiments of forming an isolation structure disposed between the interconnect structures coupled to two adjacent IC features (e.g., source/drain structures), respectively. In some embodiments, the isolation structure, as disclosed herein, is formed by recessing a portion of an interlayer dielectric overlaying the two adjacent IC features, and then filling the recess with a dielectric material. Instead of forming an island-like patterned structure, the disclosed isolation structure is formed through a damascene-like process, which can avoid the foregoing issues that the existing technologies encounter. Further, using such a damascene-like process, it may be less subjected to lithography limit in terms of shrinking the critical dimension of the isolation structure, i.e., increasing respective lengths of the interconnect structures.

The present disclosure is directed to, but not otherwise limited to, a fin-like field-effect transistor (FinFET) device. Such a FinFET device has a three-dimensional structure that includes a fin protruding from a substrate. A gate structure, configured to control the flow of charge carriers within a conduction channel of the FinFET device, wraps around the fin. For example, in a tri-gate FinFET device, the gate structure wraps around three sides of the fin, thereby forming conduction channels on three sides of the fin. It should be notes that other configurations of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. The following disclosure will continue with a FinFET example to illustrate various embodiments of the present invention. It is understood, however, that the application should not be limited to a particular type of semiconductor device.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain regions or structures, 112S and 112D, are formed in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100, and across one of the source/drain structures 112S/112D. Cross-section A-A is perpendicular to cross-section B-B and is along a longitudinal axis of the fin 104 and in a direction of, for example, a current flow between the source/drain regions 110. Subsequent figures refer to these reference cross-sections for clarity.

Figure 2:
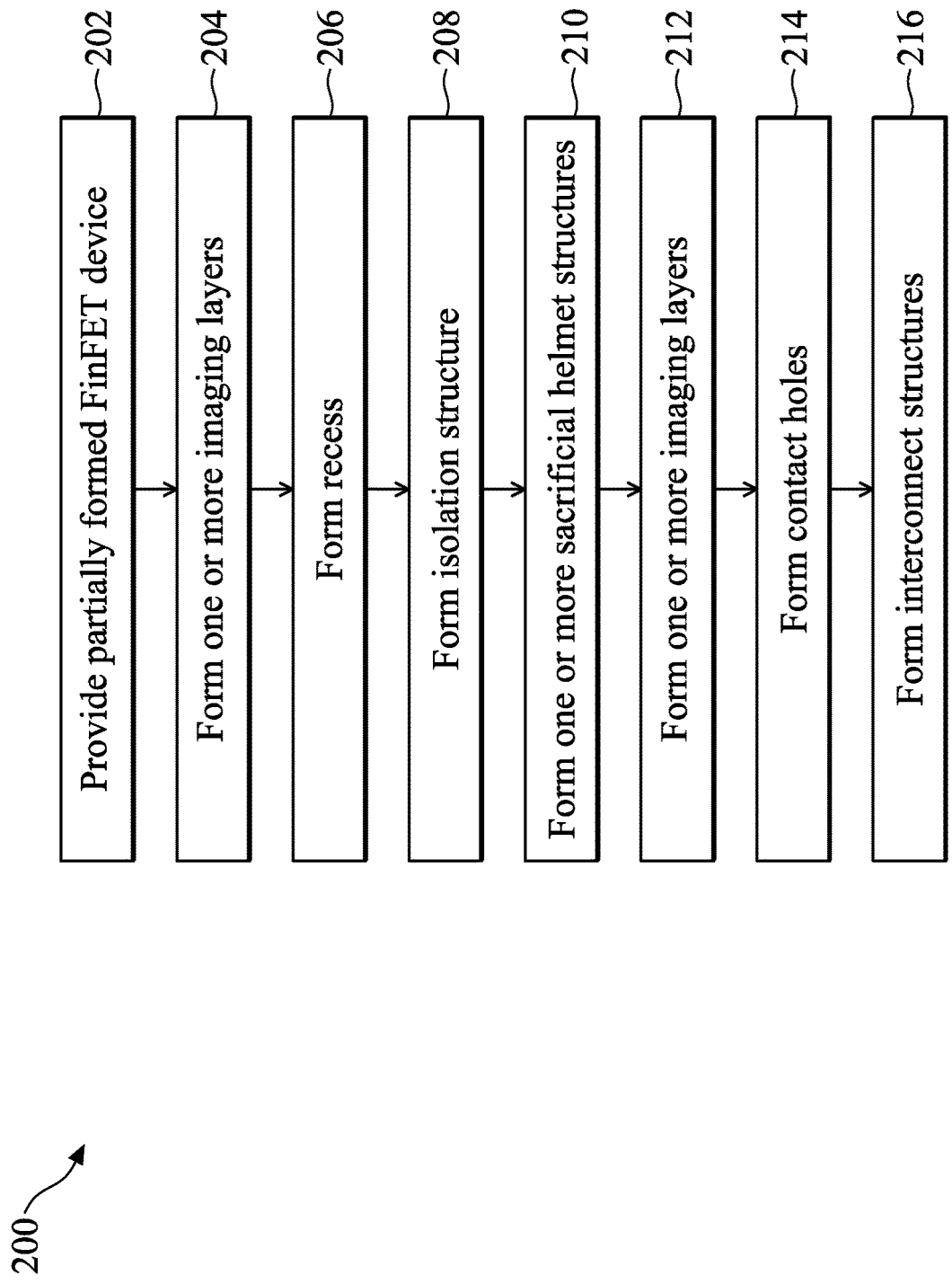
FIG. 2 illustrates a flow chart of an example method for making interconnect structures for a transistor device, in accordance with some embodiments.

FIG. 2 illustrates a flowchart of a method 200 to form interconnect structures for a transistor device, according to one or more embodiments of the present disclosure. For example, at least some of the operations of the method 200 can be used to form a FinFET device (e.g., FinFET device 100). It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3A, 3B, 4A, 4B, 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, and 10D and a top view of the example FinFET device at one of the various fabrication stages as shown in FIG. 8E, respectively, which will be discussed in further detail below.

In brief overview, the method 200 starts with operation 202 of providing a partially formed FinFET device. The method 200 continues to operation 204 of forming one or more imaging layers that include a pattern for forming an isolation structure. The method 200 continues to operation 206 of forming a recess used to form the isolation structure. The method 200 continues to operation 208 of forming the isolation structure. The method 200 continues to operation 210 of forming one or more sacrificial helmet structures. The method 200 continues to operation 212 of forming one or more imaging layers that include a pattern for forming interconnect structures. The method 200 continues to operation 214 of forming contact holes used to form the interconnect structures. The method 200 continues to operation 216 of forming the interconnect structures.

As mentioned above, FIGS. 3A-10D each illustrate, in a cross-sectional view, a portion of a FinFET device 300 at various fabrication stages of the method 200 of FIG. 2. The FinFET device 300 is substantially similar to the FinFET device 100 shown in FIG. 1, but with multiple fins, each of which is coupled with respective source/drain structures. For example, FIGS. 3A, 4A, 5A, 5B, 5C, 6A, 6B, 6C, 7A, 7B, 7C, 8A, 8B, 8C, 9A, 9B, 9C, 10A, 10B, and 10C illustrate cross-sectional views of the FinFET device 300 along cross-section B-B (as indicated in FIG. 1); FIGS. 4B, 5D, 6D, 7D, 8D, 9D, and 10D illustrate cross-sectional views of the FinFET device 300 along cross-section A-A (as indicated in FIG. 1); and FIG. 8E illustrates a top view of the FinFET device 300. Although FIGS. 3A-10D illustrate the FinFET device 300, it is understood the FinFET device 300 may include a number of other devices such as inductors, fuses, capacitors, coils, etc., which are not shown in FIGS. 3A-10D, for purposes of clarity of illustration.

Figure 3A:
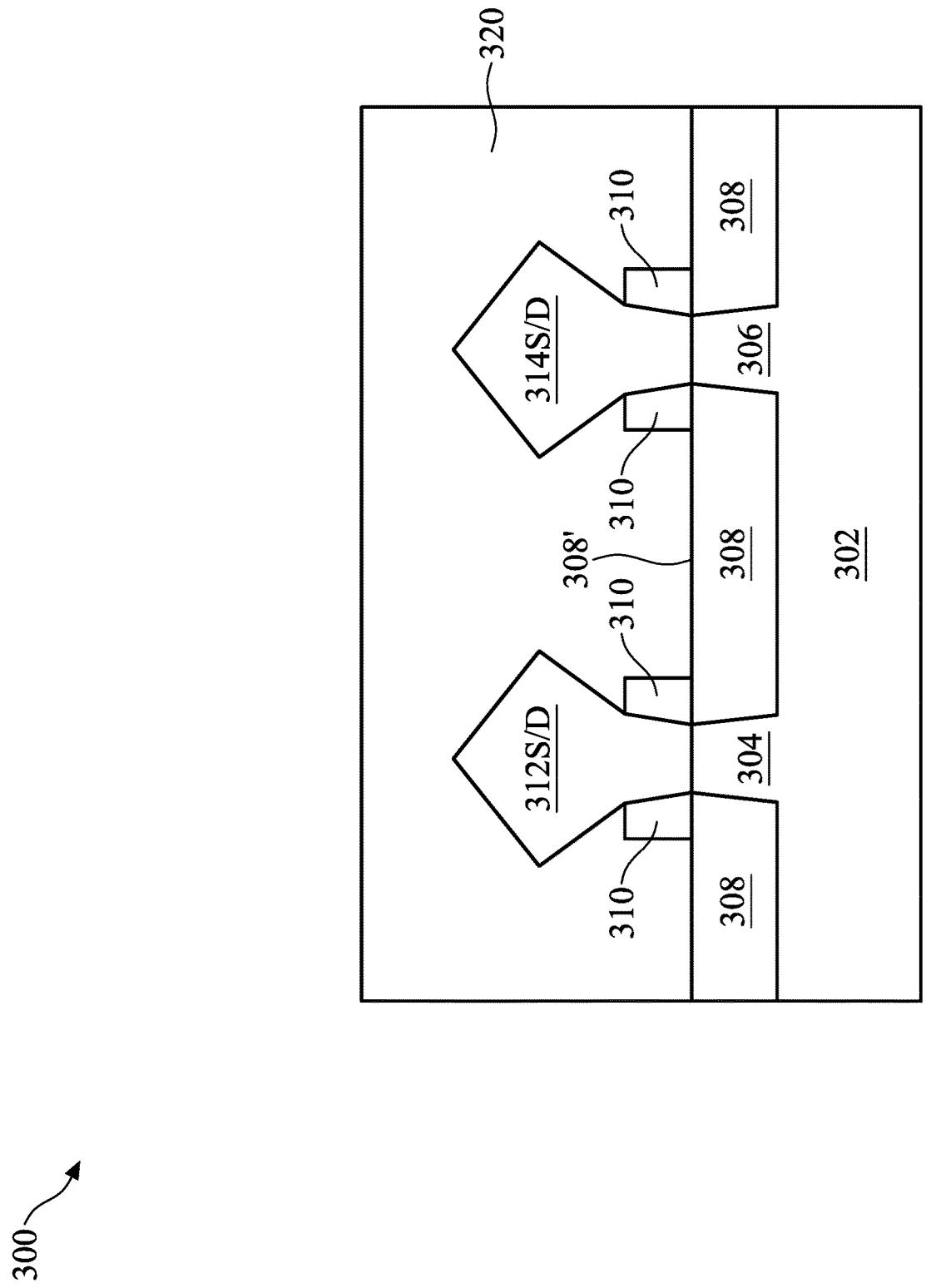

Corresponding to operation 202 of FIG. 2, FIG. 3A is a cross-sectional view of the FinFET device 300, cut along cross-section B-B (as indicated in FIG. 1), that has been partially formed at one of the various stages of fabrication. FIG. 3B illustrates a corresponding cross-sectional view of FIG. 3A that is cut along cross-section A-A (as indicated in FIG. 1).

In some embodiments, such a partially formed FinFET device 300 includes a substrate 302, two fins 304-306, an isolation structure 308, spacers 310, source/drain structures 312S/D and 314S/D, and an interlayer dielectric (ILD) 320, as shown in FIG. 3A. The fins 304 and 306, which protrude from the substrate 302, are separated apart from each other by the isolation structure 308 (sometime referred to as a shallow trench isolation (STI)). The source/drain structures 312S/D and 314S/D are coupled to the fins 304 and 306, respectively, with the spacers 310 clamping a lower portion of each of the source/drain structures 312S/D-314S/D. The ILD 320 overlays the source/drain structures 312S/D-314S/D while extending along sidewalls of an active gate structure 330, as shown in FIG. 3B, which is a cross-sectional view of the fin 304, cut along cross-section B-B (FIG. 1). The active gate structure 330 can include a gate dielectric (which can include one or more high-k dielectric layers) and a gate metal over the gate dielectric (which can include one or more metal layers). Such a gate dielectric and a gate metal are collectively shown as the active gate structure 330 for clarity of illustration. The active gate structure 330, whose sidewalls are extended by the spacers 310, is formed over a central portion of the fin 304 (e.g., overlaying a top surface and sidewalls of the fin 304), with the source/drain structures 312S-D disposed on its opposite sides.

Operations performed to form the FinFET device 300 shown in FIGS. 3A-B will be briefly discussed as follows: providing the substrate 302; forming the fins 304-306;

forming the isolation structures 308; forming a dummy gate structure; forming the spacers 310; forming the source/drain structures 312S/D and 314S/D; forming the ILD 320; and replacing the dummy gate structure with the active gate structure 330. In some embodiments, subsequently to forming the active gate structure 330, an upper portion of the active gate structure 330 (and the spacers 310 extending along its sidewalls) is removed (or etched back) to form a recess 332, as shown in FIG. 3B. Depending on a height of the active gate structure 330 with respect to a height of the ILD 320, the recess 332 may have a height ranging from about 10 nanometers (nm) to about 80 nm. Such a recess 332 may later be partially filled with a sacrificial helmet structure that is configured to protect the active gate structure 330 while forming contact holes for the source/drain structures 312S/D and 314S/D, which will be discussed below with respect to FIG. 7D.

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Next, the fins 304-306 are formed by patterning the substrate 302 using, for example, photolithography and etching techniques. For example, a mask layer, such as a pad oxide layer and an overlying pad nitride layer, is formed over the substrate 302. The pad oxide layer may be a thin film comprising silicon oxide formed, for example, using a thermal oxidation process. The pad oxide layer may act as an adhesion layer between the substrate 302 and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example. The fins 304-306 may be patterned by any suitable method. For example, the fins 304-306 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Next, the isolation structures 308, which are formed of an insulation material, are formed to electrically isolate neighboring fins (e.g., the fins 304 and 306) from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form a top surface of the isolation structures 308 and a top surface of the fins 304-306 that are coplanar (not shown). The above-mentioned patterned mask may also be removed by the planarization process.

Next, the isolation structures are recessed to form shallow trench isolation (STI) 308, as shown in FIGS. 3A-B. The isolation structures 308 are recessed such that the fins 304-306 can protrude from between neighboring STIs. Such protruded fins 304-306 can function as the conduction channels of a first transistor and a second transistor, respectively. Respective top surfaces 308' of the STIs 308 may have a flat surface (as illustrated), a convex surface, a concave surface (such as dishing), or combinations thereof. The top surfaces of the STIs 308 may be formed flat, convex, and/or concave by an appropriate etch. The STIs 308 may be recessed using an acceptable etching process, such as one that is selective to the material of the isolation structures. For example, a dry etch or a wet etch using dilute hydrofluoric (DHF) acid may be performed to recess the isolation structures.

Next, a dummy gate structure is formed to overlay a respective (e.g., central) portion of each of the fins 304-306. The dummy gate structure may also have a lengthwise direction (e.g., direction B-B of FIG. 1) substantially perpendicular to the lengthwise direction (e.g., direction of A-A of FIG. 1) of the fins 304-306. The spacers 310 are then formed along sidewalls of the dummy gate structure. The spacers 310 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the spacers 310.

Next, the source/drain structures 312S/D and 314S/D are formed in recesses of the fins 304-306, respectively, that are adjacent to the dummy gate structure. The recesses are formed by, e.g., an anisotropic etching process using the dummy gate structures as an etching mask, in some embodiments, although any other suitable etching process may also be used.

The source/drain structures 312S/D and 314S/D are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIG. 3B (with the source/drain structures 312S/D as a representative example), the epitaxial source/drain structures 312S/D may have surfaces raised from the top surface of the fin 304 (e.g. raised above the non-recessed portions of the fin 304) and may have facets. In some embodiments, the source/drain structures of the adjacent fins may merge to form a continuous epitaxial source/drain region (not shown). In some embodiments, the source/drain structures of the adjacent fins may not merge together and remain separate source/drain structures (as shown in FIG.

3A). When the resulting FinFET device is an n-type FinFET, the source/drain structures 312S/D and 314S/D can include silicon carbide (SiC), silicon phosphorous (SiP), phosphorous-doped silicon carbon (SiCP), or the like. When the resulting FinFET device is a p-type FinFET, the source/drain structures 312S/D and 314S/D can include SiGe, and a p-type impurity such as boron or indium.

The source/drain structures 312S/D and 314S/D may be implanted with dopants, followed by an annealing process. The implanting process may include forming and patterning masks such as a photoresist to cover the regions of the FinFET device 300 that are to be protected from the implanting process. The source/drain structures 312S/D and 314S/D may have an impurity (e.g., dopant) concentration in a range from about $1\times10^{19}$ $cm^{-3}$ to about $1\times10^{21}$ $cm^{-3}$. P-type impurities, such as boron or indium, may be implanted in the source/drain structures 312S/D and 314S/D of a P-type transistor. N-type impurities, such as phosphorous or arsenide, may be implanted in the source/drain structures 312S/D and 314S/D of an N-type transistor. In some embodiments, the source/drain structures 312S/D and 314S/D may be in situ doped during their growth.

Next, the ILD 320 is formed over the source/drain structures 312S/D and 314S/D, with a contact etch stop layer (not shown) disposed therebetween. The contact etch stop layer can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like. The ILD 320 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 4A:
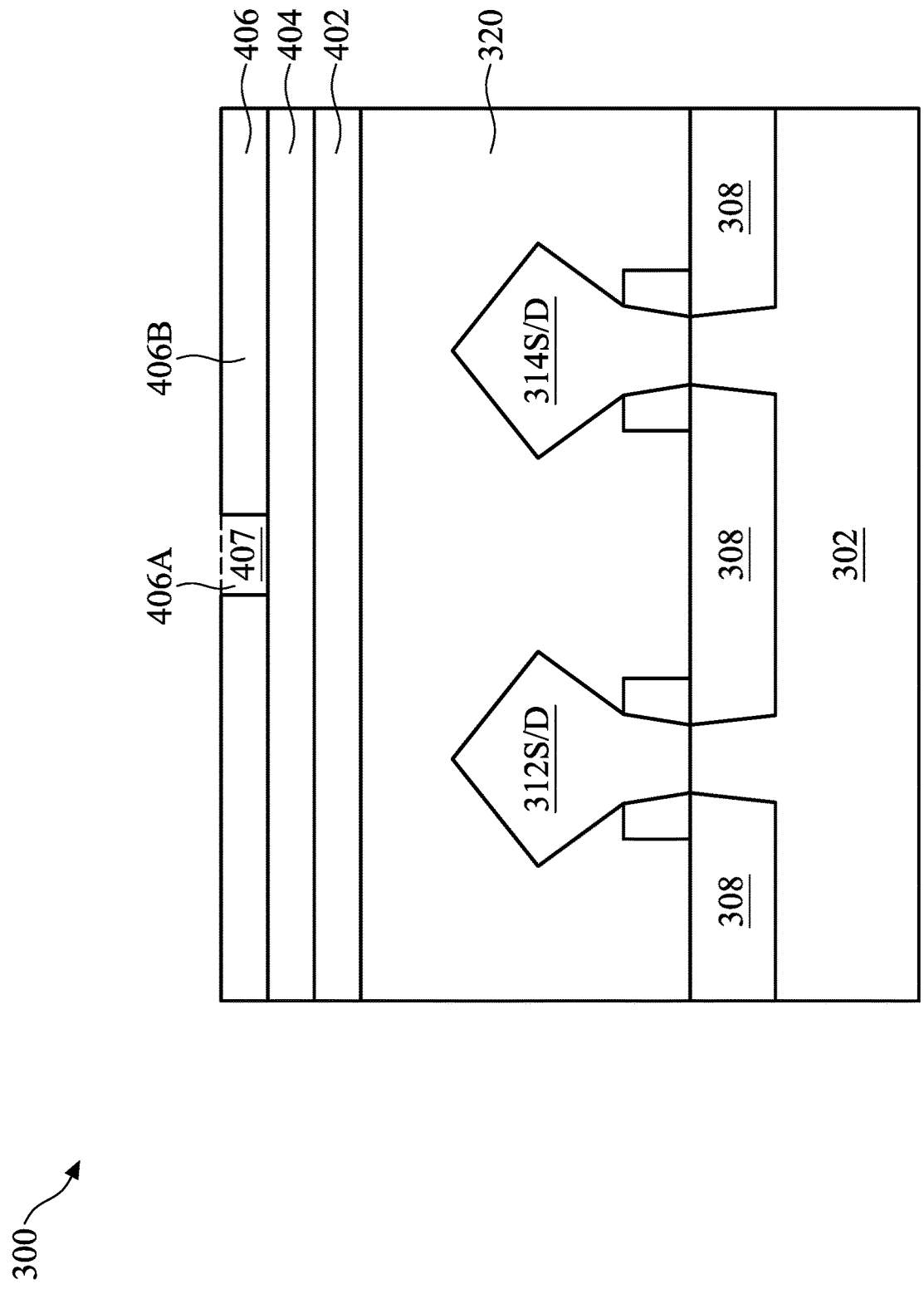
Figure 4B:
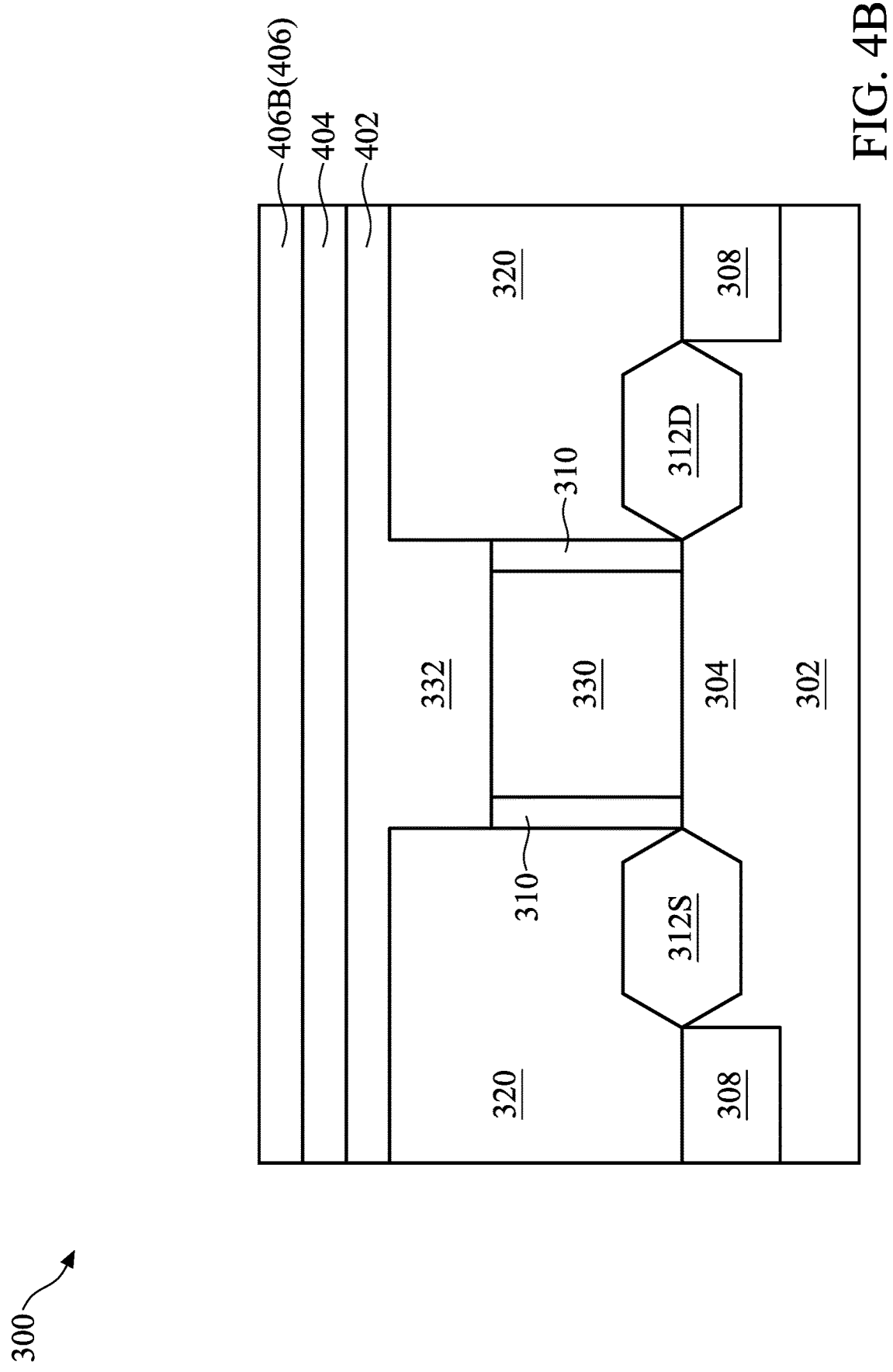

Corresponding to operation 204 of FIG. 2, FIG. 4A is a cross-sectional view of the FinFET device 300, cut along cross-section B-B (as indicated in FIG. 1), that includes one or more imaging (or patternable) layers 402, 404, and 406 at one of the various stages of fabrication. FIG. 4B illustrates a corresponding cross-sectional view of FIG. 4A that is cut along cross-section A-A (as indicated in FIG. 1).

The imaging layer can be a photoresist layer (also referred to as a resist layer, photosensitive layer, patterning layer, light sensitive layer, etc.) that is responsive to an exposure process for creating patterns. The imaging layer may be a positive-type or negative-type resist material and may have a multi-layer structure. One example resist material is a chemical amplifier (CA) resist. In the present example, a tri-layer resist patterning scheme is utilized. Thus, the imaging layer includes three imaging layers: bottom layer 402, middle layer 404, and upper layer 406. The bottom layer 402 is formed over the ILD 320, the middle layer 404 is formed over the bottom layer 404, and the upper layer 406 is formed over the middle layer 404. It is understood that other patterning layer schemes, such as a single imaging layer, may be used while remaining within the scope of the present disclosure.

The bottom, middle, and upper layers 402-406 can include any suitable material. For example, the layers 402-406 may include various organic and/or inorganic materials. In one example, the bottom layer 402 may include an organic layer, the middle layer 404 may include an inorganic layer, and the upper layer 406 may include an organic layer. The bottom organic layer 402 may include a photoresist material, an anti-reflective coating (ARC) material, a polymer material, and/or other suitable materials. The middle inorganic layer 404 may include an oxide layer, such as a low temperature CVD oxide, an oxide derived from TEOS (tetraethylorthosilicate), silicon oxide, or silane oxide. Another example includes the middle layer 404 as a Si-containing anti-reflective coating (ARC) material, such as a 42% Si-containing ARC layer. The upper organic layer 406 may comprise an organic photoresist material. Further, the imaging layers 402-406 can have any suitable thickness. In one non-limiting example, the bottom layer 402 has a thickness of approximately 1000 angstroms, the middle layer 404 has a thickness of approximately 250 angstroms, and the upper layer 406 has a thickness of approximately 500 angstroms.

Utilizing the tri-layer patterning technique, the upper, photoresist layer 406 is first patterned by a photolithography process and/or processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the upper layer 406 while protecting one or more other portions of the upper layer 406, for example, 406A being unexposed and 406B being exposed, or 406A being exposed and 406B being unexposed.

In an example where the upper layer 406 includes a negative resist material, the exposed portions (e.g., 406B) may become insoluble upon exposure, while the unexposed portions (e.g., 406A) remain soluble. In another example where the upper layer 406 includes a positive resist material, the exposed portions (e.g., 406A) may become soluble upon exposure, while the unexposed portions (e.g., 406B) remain insoluble. The patterning of the photoresist layer 406 can use one or more masks to form the one or more exposed and unexposed portions 406A-B.

The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Next, portions of the upper layer 406 are removed to form one or more openings 407. In the foregoing example where the upper layer 406 includes negative resist material, the unexposed portion 406A of the upper layer 406 is removed to form the opening 407 in the upper layer 406. The unexposed portion 406A can be removed by any suitable process. The resulting upper layer 406, with the opening 407, can define a recess for an isolation structure to be fabricated between the adjacent source/drain structures 312S/D and 314S/D, which will be discussed in detail below. It is noted that along the cross-section A-A (FIG. 4B), the upper layer 406 may include the exposed portion 406B over the active gate structure 330 and source/drain structures 312S/D (and source/drain structures 314S/D, which are not shown).

Figure 5A:
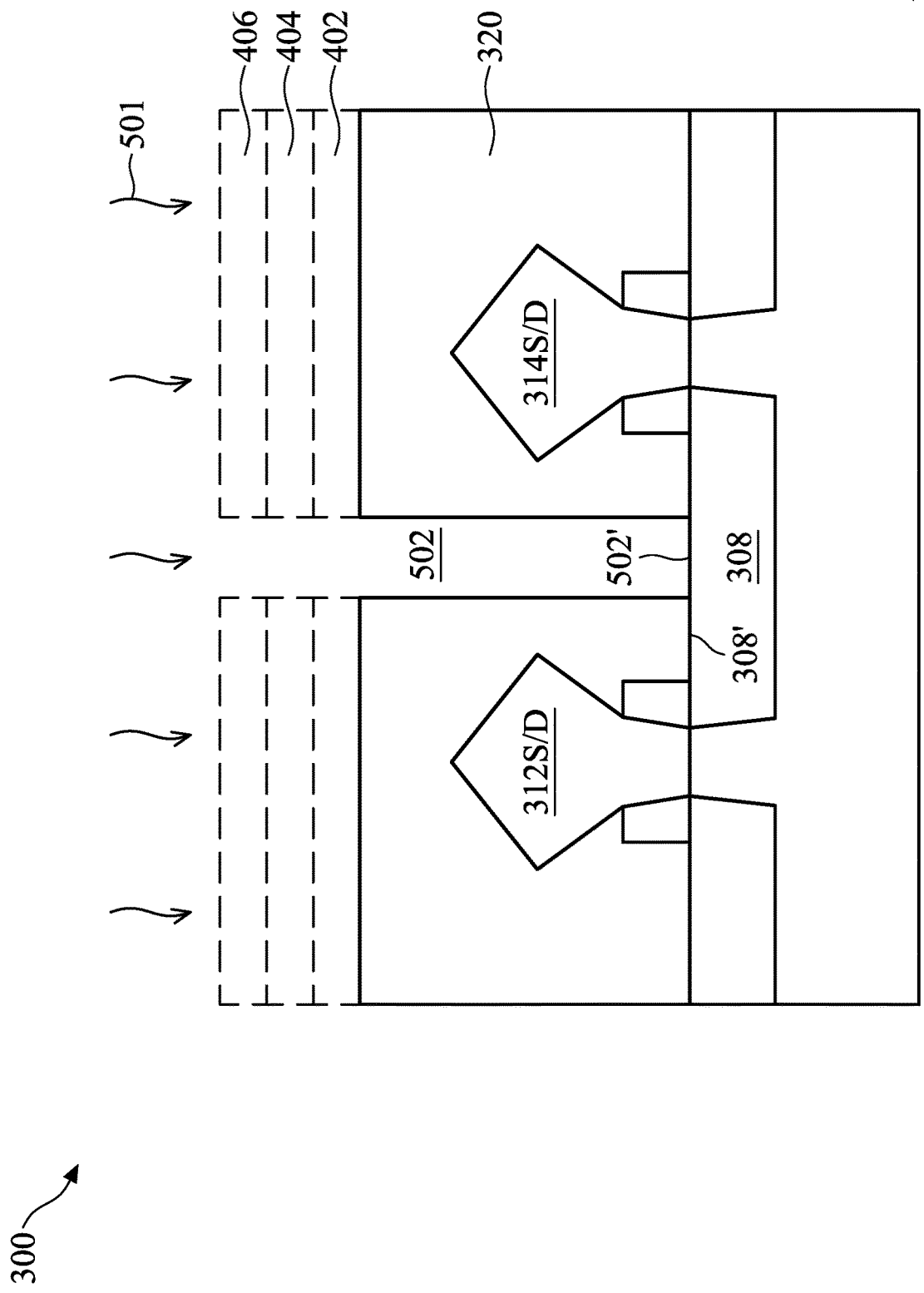
Figure 5B:
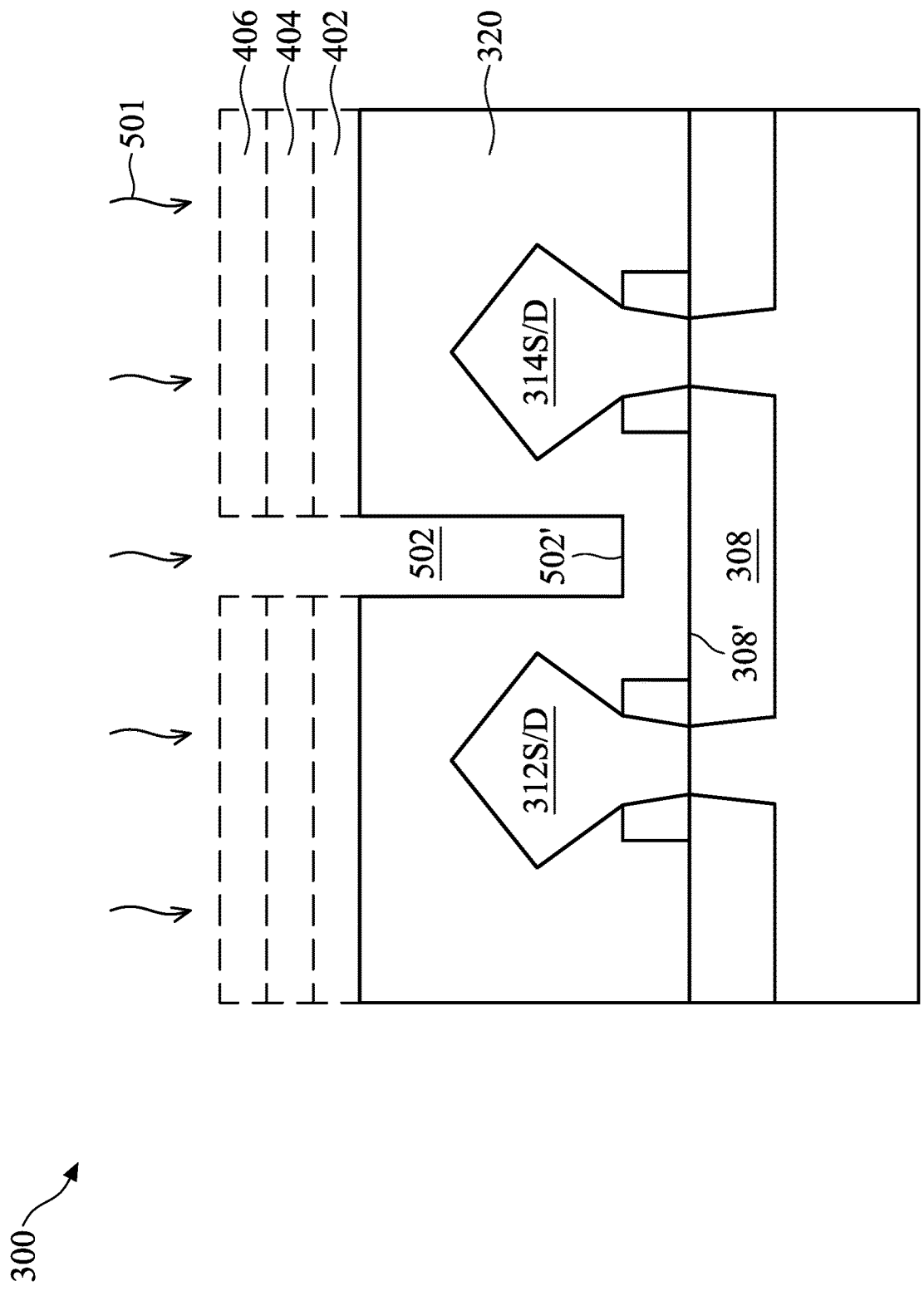
Figure 5C:
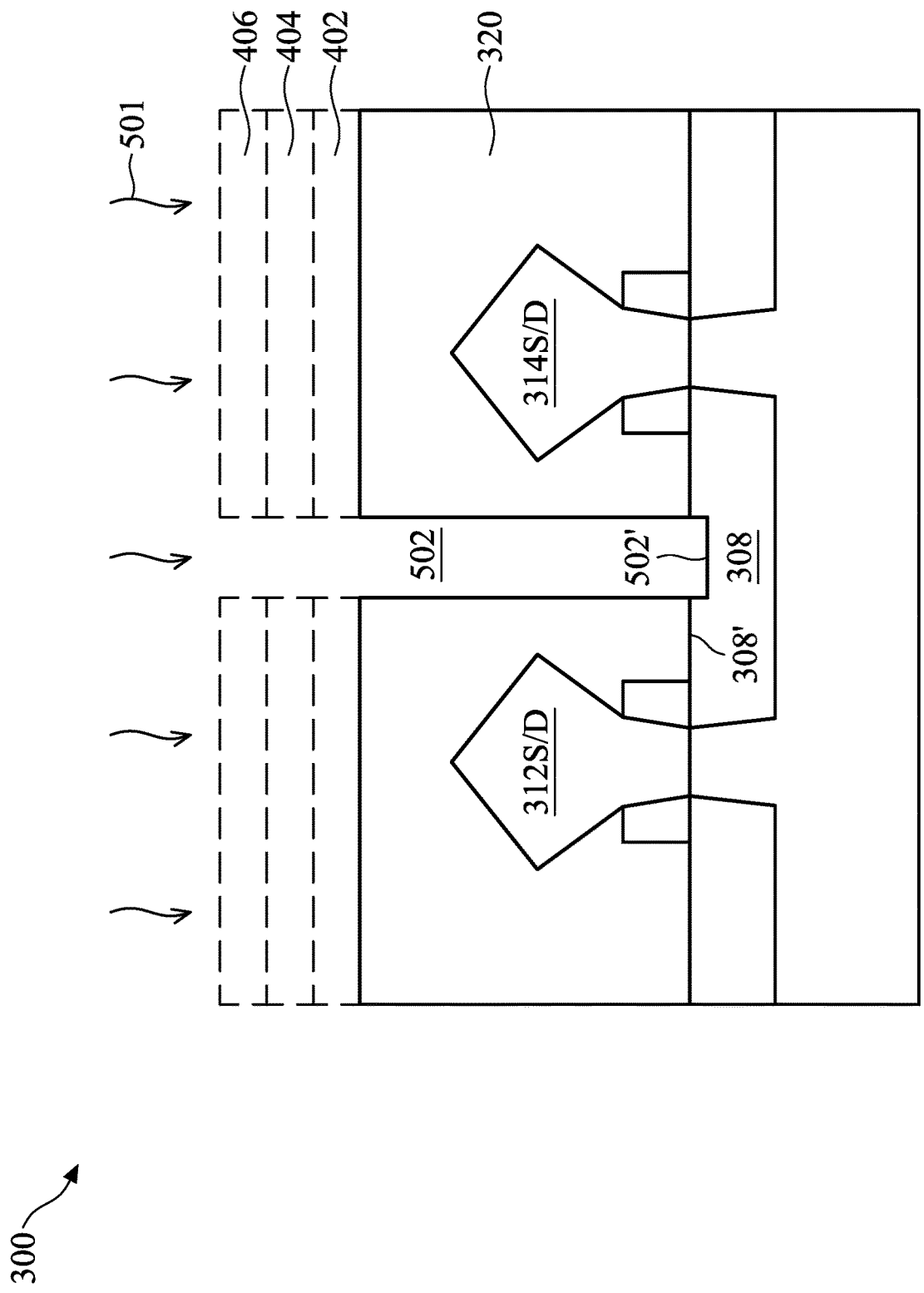
Figure 5D:
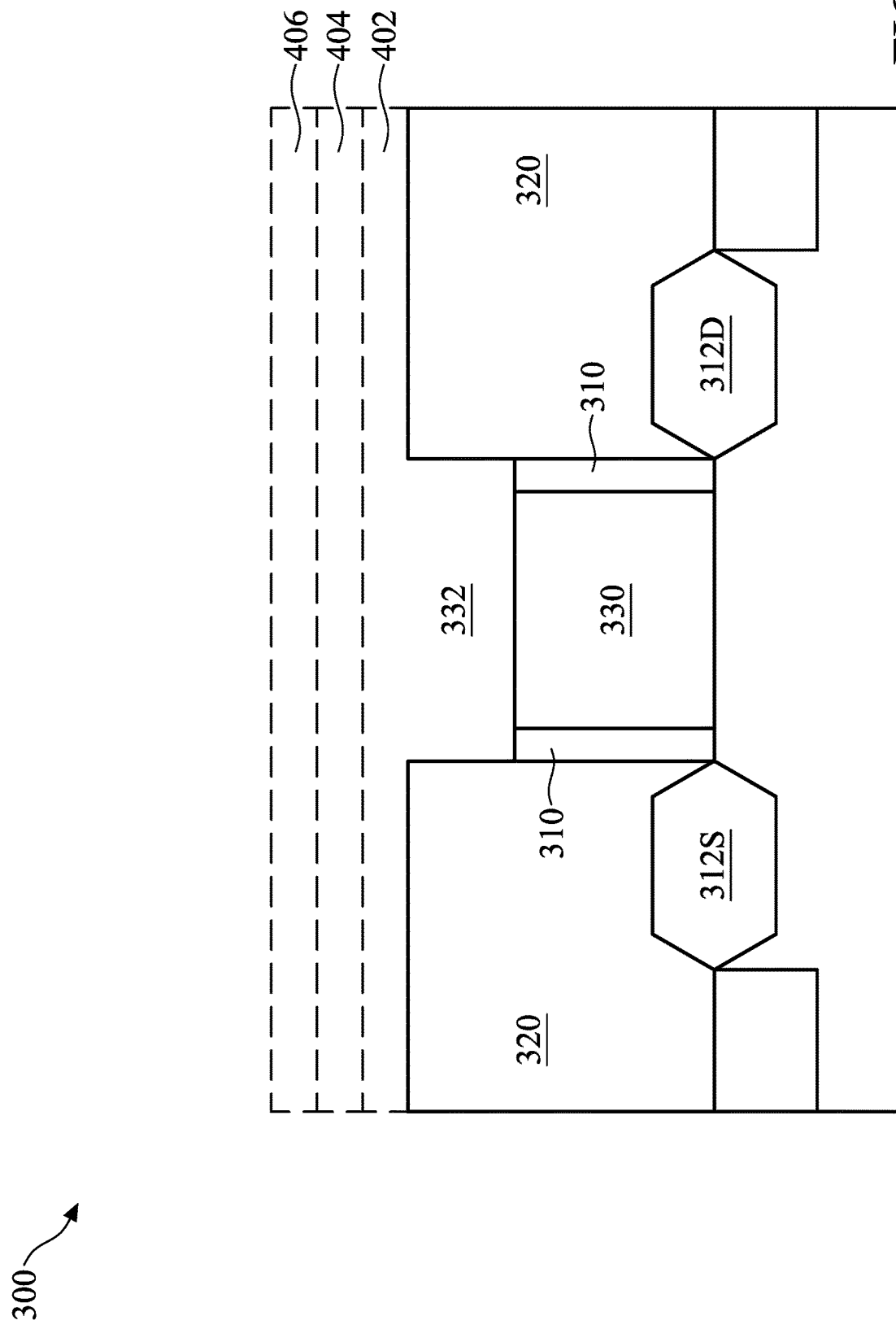

Corresponding to operation 206 of FIG. 2, FIG. 5A is a cross-sectional view of the FinFET device 300, cut along cross-section B-B (as indicated in FIG. 1), that includes at least one recess (trench, or otherwise opening) 502 formed between the adjacent source/drain structures 312S/D and 314S/D at one of the various stages of fabrication. For example, the recess 502 may be disposed between the source/drain structures 312S and 314S, between the source/drain structures 312D and 314D, or between the source/drain structures 312S and 314S and between the source/drain structures 312D and 314D. FIGS. 5B and 5C are respective cross-sectional views of the FinFET device 300, cut along cross-section B-B, in which the recess 502 is configured in other embodiments. FIG. 5D illustrates a corresponding cross-sectional view of one of FIGS. 5A-C that is cut along cross-section A-A (as indicated in FIG. 1).

It is understood that the recess 502 may not be limited to being formed between the adjacent source/drain structures, while remaining the scope of the present disclosure. For example, one or more other recesses (not shown for purposes of brevity) may be formed opposite the source/drain structures 312S/D and 314S/D from the recess 502 shown in FIGS. 5A-C. Each of such other recesses may have a profile similar to one of the examples shown in FIGS. 5A-C. In some embodiments, such other recesses may be concurrently formed with the recess 502.

Upon forming the opening 407, a pattern of the upper layer 406 (e.g., the opening 407) is then transferred to the underlying layers. For example, the opening 407 is transferred to the middle layer 404, and to the bottom layer 402 via one or more etching process, including various dry etching, wet etching, and/or other etching methods (e.g., reactive ion etching). Subsequently, the remaining upper, middle, and bottom layers 402-406 are removed by any suitable process, including a photoresist stripping process. It is understood that the upper layer, middle layer, and bottom layer 402-406 may be simultaneously or independently removed. For example, while transferring the 407 from the upper layer 406 to the middle layer 404, the upper layer 406 may be simultaneously removed; and while transferring the opening in the middle layer 404 to the bottom layer 402, the middle layer 404 may be simultaneously removed.

Using at least one of the remaining imaging layers 402-406, with the transferred opening (shown in dotted lines in FIGS. 5A-C), as a protective mask, a portion of the ILD 320 is removed via an etching process 501 to form the recess 502. The etching process 501 can include a dry etching process that implements an oxygen-containing gas, fluorine-containing gas (e.g., $CF_4$, $NF_3$, $SF_6$, $CH_2F_2$, $CHF_3$, $C_4F_6$, $C_4F_8$), other suitable gases and/or plasmas, or combinations thereof. After the etching process 501, the remaining imaging layer(s) are removed.

FIG. 5A illustrates an example where the etching process 501 stops upon reaching the STI 308, which causes the recess 502 to expose the top surface 308' of the STI 308. In other words, a bottom surface 502' of the recess 502 is leveled with the top surface 308' of the STI 308. FIG. 5B illustrates another example where the etching process 501 stops prior to reaching the STI 308, which causes the recess 502 not to expose the top surface 308' of the STI 308. In other words, the bottom surface 502' of the recess 502 is vertically above the top surface 308' of the STI 308, with a portion of the ILD 320 disposed therebetween. FIG. 5C illustrates yet another example where etching process 501 stops after recessing a portion of the STI 308, which causes the recess 502 to extend into the STI 308. In other words, the bottom surface 502' of the recess 502 is vertically below the top surface 308' of the STI 308. Since the pattern of the upper layer 406 is not located above the active gate structures 330 and the source/drain structures 312S/D (as illustrated in FIG. 4B), the active gate structure 330 and the source/drain structures 312S/D may remain intact during this fabrication stage (as illustrated in FIG. 5D).

Figure 6A:
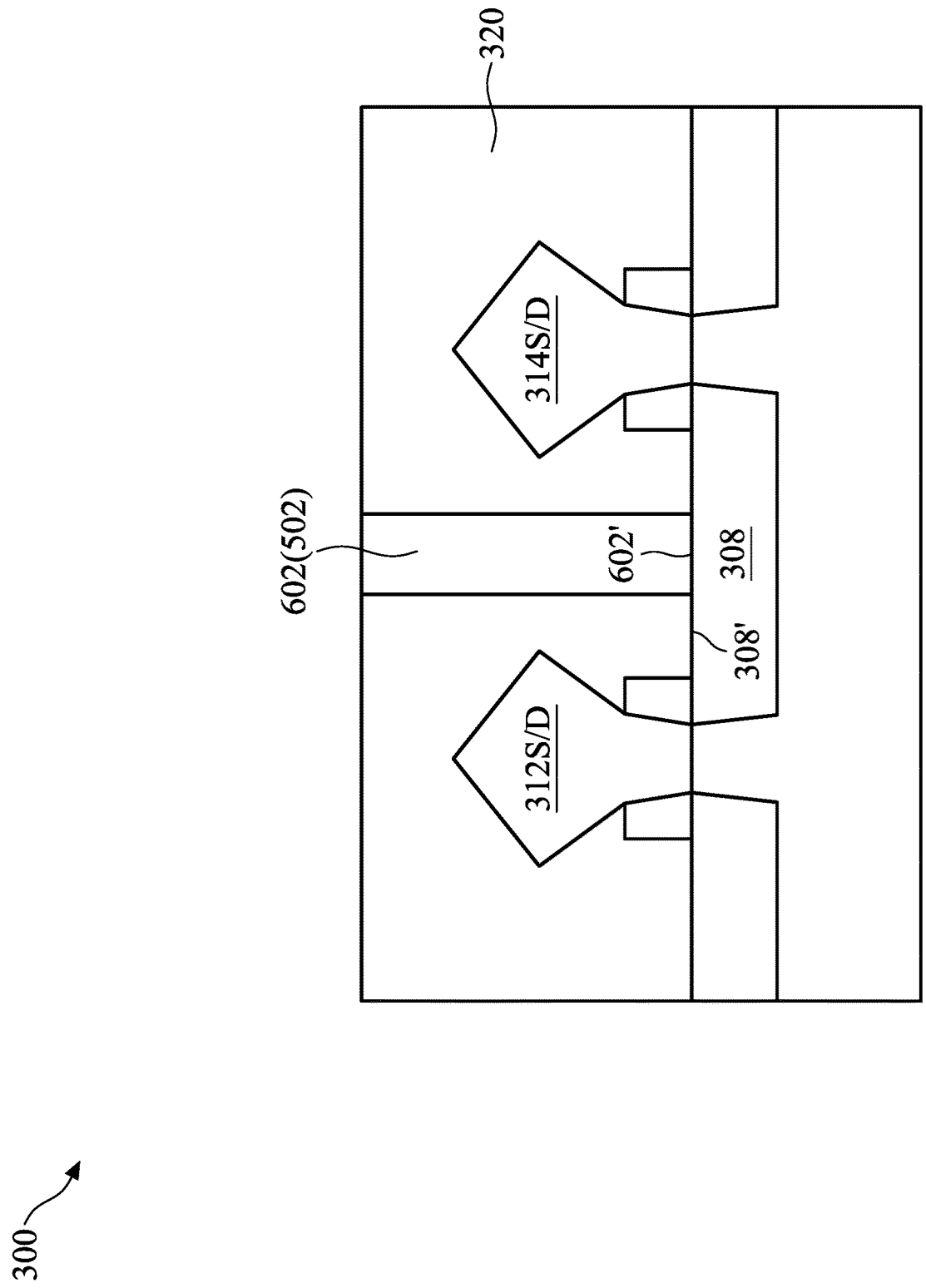
Figure 6B:
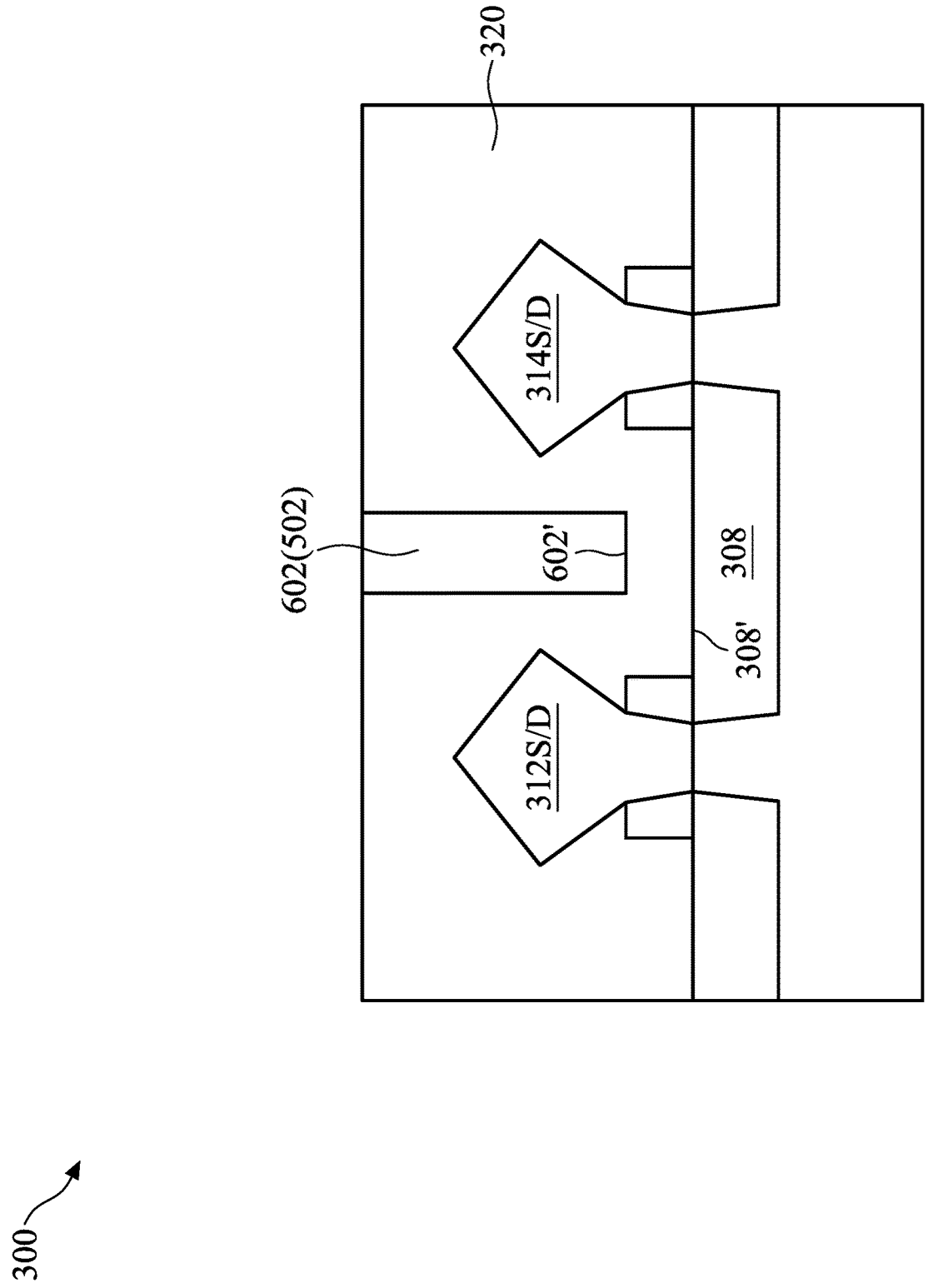
Figure 6C:
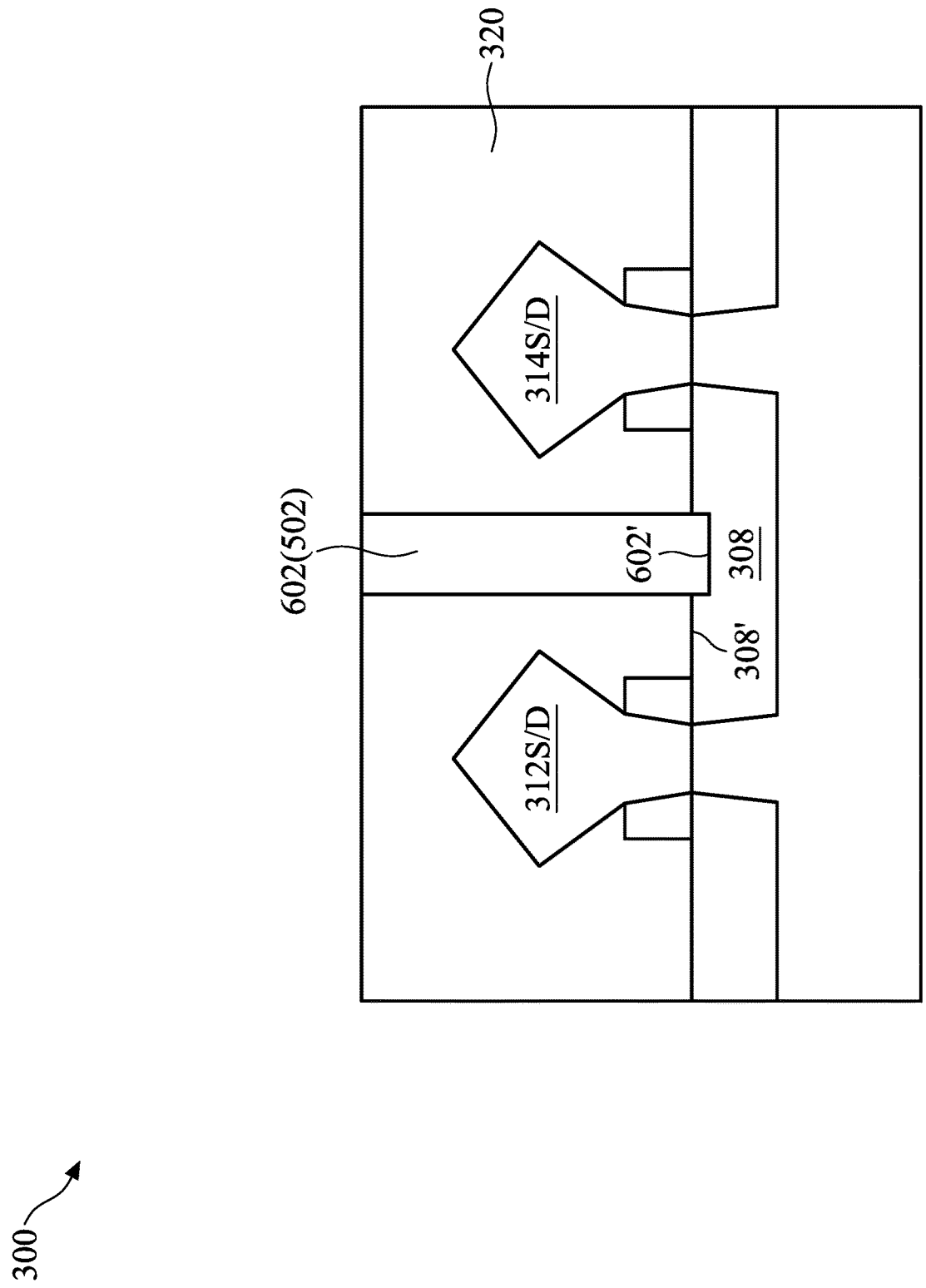

Corresponding to operation 208 of FIG. 2, FIG. 6A is a cross-sectional view of the FinFET device 300, cut along cross-section B-B (as indicated in FIG. 1), that includes an isolation structure 602 formed between the adjacent source/drain structures 312S/D and 314S/D at one of the various stages of fabrication. FIGS. 6B and 6C are respective cross-sectional views of the FinFET device 300, cut along cross-section B-B, in which the isolation structure 602 is configured in other embodiments. The isolation structures 602 shown in FIGS. 6A-C are formed based on the recesses 502 shown in FIGS. 5A-C, respectively. FIG. 6D illustrates a corresponding cross-sectional view of one of FIGS. 6A-C that is cut along cross-section A-A (as indicated in FIG. 1).

As mentioned above, one or more other recesses may be formed opposite the source/drain structures 312S/D and 314S/D from the recess 502 shown in FIGS. 5A-C. Upon such other recesses being formed, one or more other isolation structures (not shown for purposes of brevity) may be concurrently formed with the isolation structure 602 shown in FIGS. 6A-C by filling the other recesses with the same material of the isolation structure 602.

The isolation structure 602 can be formed by filling the recess 502 via low-pressure chemical vapor deposition (LPCVD), plasma enhanced chemical vapor deposition (PECVD), atomic layer deposition (ALD), or combinations thereof with a dielectric material (e.g., silicon nitride, silicon oxynitride, silicon carbonitride, or the like). In various embodiments, the isolation structure 602 may include a dielectric material having different etching selectivity than the ILD 320, which will be discussed below with respect to FIGS. 7A-D. After filling the recess 502, a CMP process may be performed to remove the excess dielectric material so as to level a top surface of the isolation structure 602 with a top surface of the ILD 320. The isolation structure 602 can inherit the dimensions and profile of the recess 502.

For example in FIG. 6A where the isolation structure 602 is formed based on the recess 502 shown in FIG. 5A, the isolation structure 602 can have a bottom surface 602' that is in contact with the top surface 308' of the STI 308. For example in FIG. 6B where the isolation structure 602 is formed based on the recess 502 shown in FIG. 5B, the isolation structure 602 can have the bottom surface 602' vertically located above the top surface 308' of the STI 308. For example in FIG. 6C where the isolation structure 602 is formed based on the recess 502 shown in FIG. 5C, the isolation structure 602 can have the bottom surface 602' that is vertically below the top surface 308' of the STI 308. Referring to FIG. 6D, concurrently with forming the isolation structure 602 (shown in FIGS. 6A-C), the recess 332 above the active gate structure 330 may also be filled with the same dielectric material, which causes an isolation structure 604 to be formed over the active gate structure 330. The same CMP process may cause a top surface of the isolation structure to level with the top surface of the ILD 320 as well.

Figure 7A:
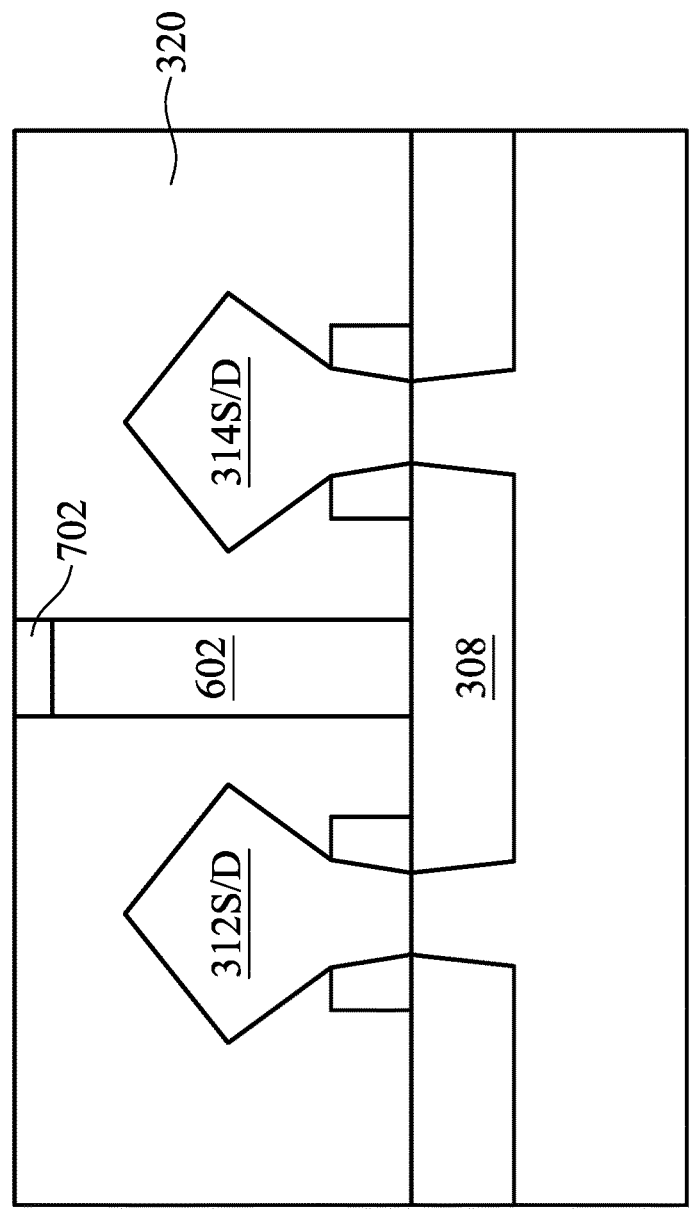
Figure 7C:
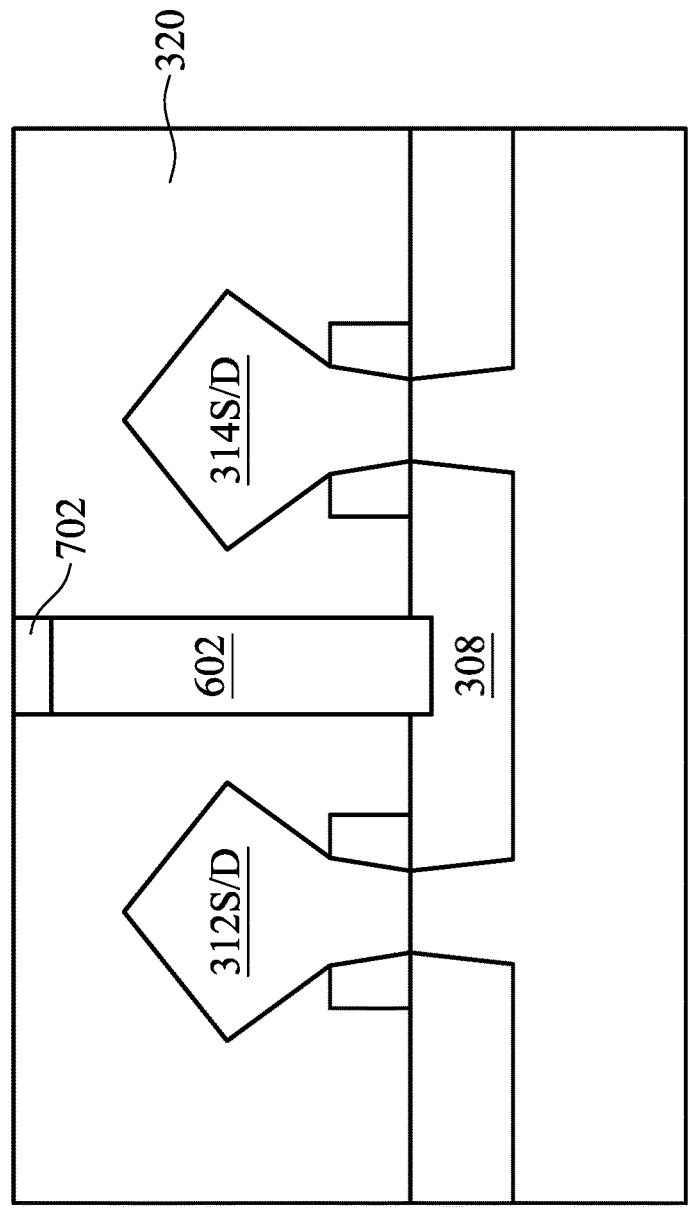
Figure 7D:
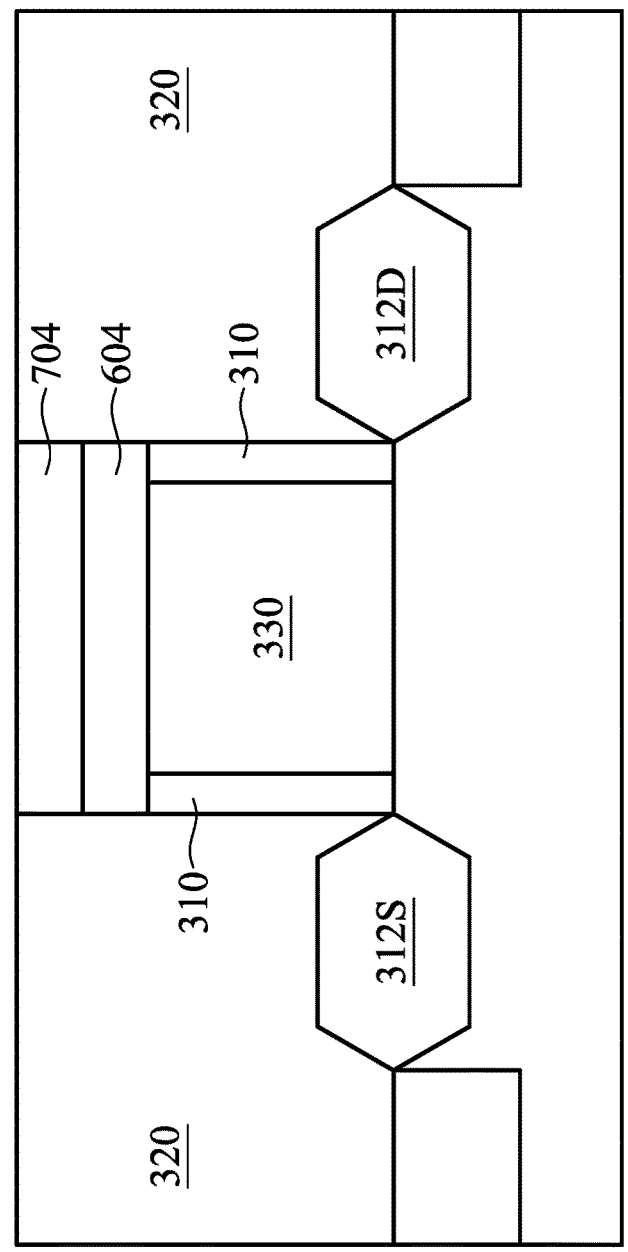

Corresponding to operation 210 of FIG. 2, FIG. 7A is a cross-sectional view of the FinFET device 300, cut along cross-section B-B (as indicated in FIG. 1), that includes a sacrificial helmet structure 702 formed above the isolation structure 602 at one of the various stages of fabrication. FIGS. 7B and 7C are respective cross-sectional views of the FinFET device 300, cut along cross-section B-B, in which the isolation structure 602 is formed in other embodiments, with the sacrificial helmet structure 702 formed thereon. The sacrificial helmet structures 702 shown in FIGS. 7A-C are formed on the isolation structures 602 shown in FIGS. 6A-C, respectively. FIG. 7D illustrates a corresponding cross-sectional view of one of FIGS. 7A-C that is cut along cross-section A-A (as indicated in FIG. 1).

The sacrificial helmet structure 702 may be formed by first recessing an upper portion of the isolation structure 602, then filling the recess with an anti-etching material, and performing a CMP process. In some embodiments, the step of recessing the upper portion of the isolation structure 602 may include a wet etching and/or a dry etching process. As mentioned above, the dielectric materials of the ILD 320 and the isolation structure 602 have different etching selectivities to a certain etchant and thus, recessing the upper portion of the isolation structure 602 may require no patterning process.

The wet etching process can use an acid-based etchant such as, for example, sulfuric acid ($H_2SO_4$), perchloric acid ($HClO_4$), hydroiodic acid (HI), hydrobromic acid (HBr), nitric acide ($HNO_3$), hydrochloric acid (HCl), acetic acid ($CH_3COOH$), citric acid ($C_6H_8O_7$), potassium periodate ($KIO_4$), tartaric acid ($C_4H_6O_6$), benzoic acid ($C_6H_5COOH$), tetrafluoroboric acid ($HBF_4$), carbonic acid ($H_2CO_3$), hydrogen cyanide (HCN), nitrous acid ($HNO_2$), hydrofluoric acid (HF), phosphoric acid ($H_3PO_4$), or combinations thereof. In some examples, an alkaline-based etchant may be used. Such etchants may include but are not limited to ammonium hydroxide ($NH_4OH$) and potassium hydroxide (KOH). The dry etching process can implement an oxygen-containing gas, fluorine-containing gas (e.g., $CF_4$, $NF_3$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, or combinations thereof.

Next, the anti-etching material is deposited over the ILD 320 to fill the etched upper portion of the isolation structure 602. The anti-etching material can include a material selected from a group consisting of: silicon (Si), tungsten carbide (WC), metal oxide (e.g., $Al_2O_3$, MgO), tantalum nitride (TaN), titanium nitride (TiN), or combinations thereof. Such an anti-etching material may be selected to form the sacrificial helmet structure 702 that can protect the isolation structure 602 against etchants while forming contact holes for the source/drain structures 312S/D and 314S/D, which will be discussed below with respect to FIGS. 9A-D.

After filling the etched upper portion, a CMP process is performed to level a top surface of the sacrificial helmet structure 702 with the top surface of the ILD 320. Referring to FIG. 7D, concurrently with forming the sacrificial helmet structure 702 (shown in FIGS. 7A-C), an upper portion of the isolation structure 604 may also be removed and filled with the same anti-etching material, which causes a sacrificial helmet structure 704 to be formed over the isolation structure 604. The same CMP process may cause a top surface of the sacrificial helmet structure 704 to level with the top surface of the ILD 320 as well. In some embodiments, the etched upper portion of the isolation structures 602 and 604 may have a depth of about 3~30 nm, and the sacrificial helmet structures 702 and 704 may inherit the dimensions and profiles of such etched upper portions, respectively. In some embodiments, after the CMP process, the sacrificial helmet structures 702 and 704 may have a height slightly less than the depth of the etched upper portions, which may range from about 2 nm to about 25 nm.

Figure 8A:
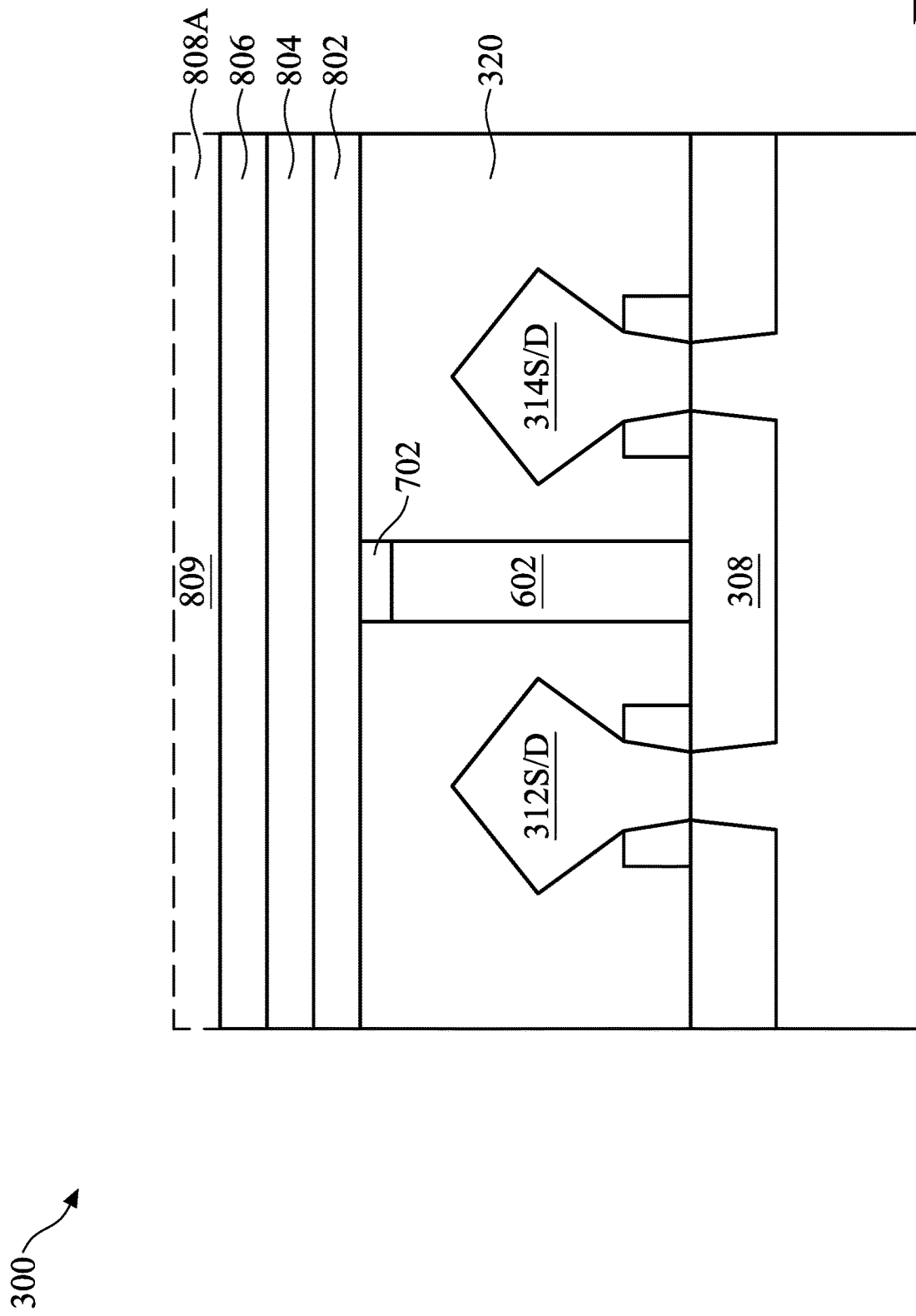
Figure 8B:
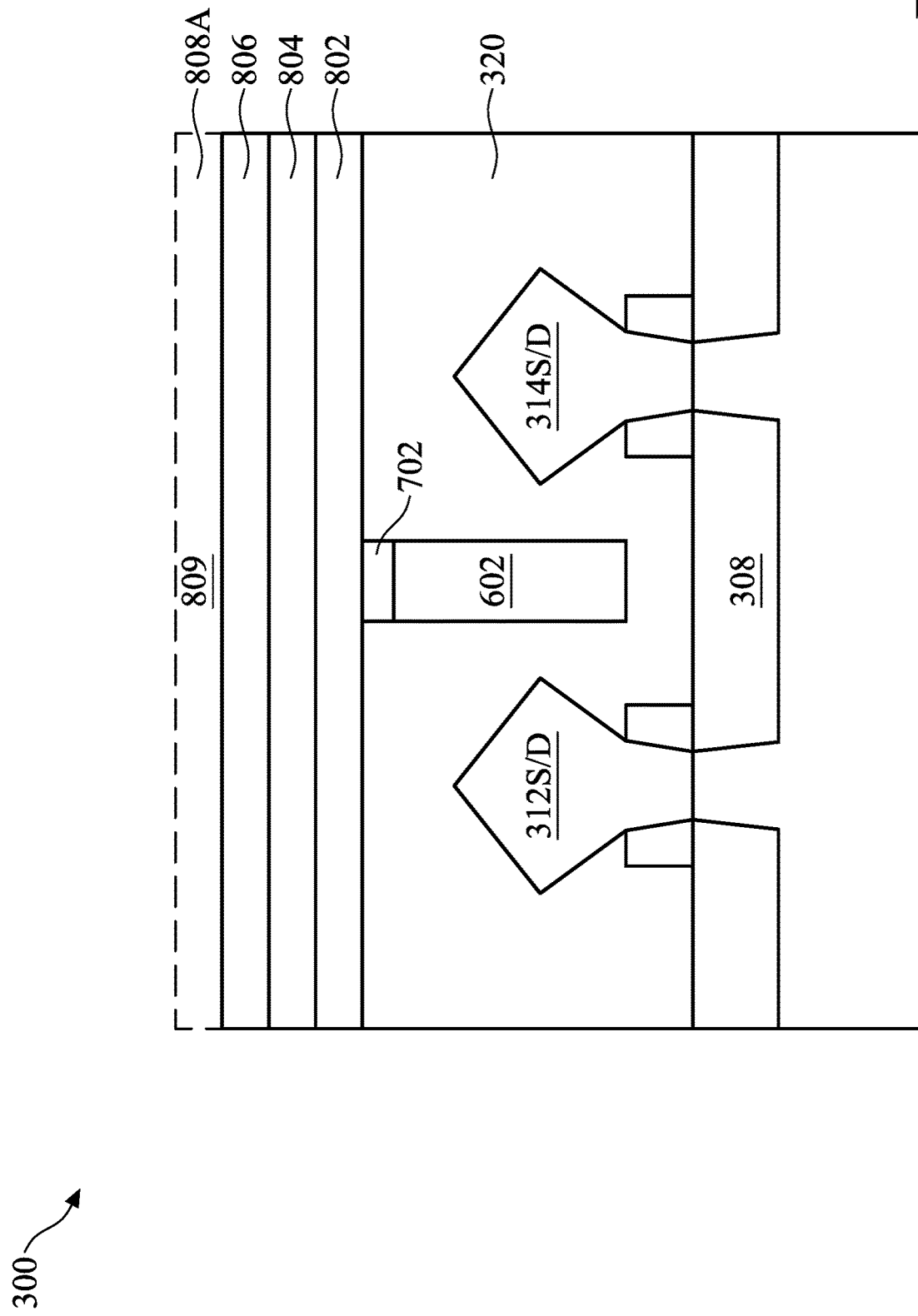
Figure 8C:
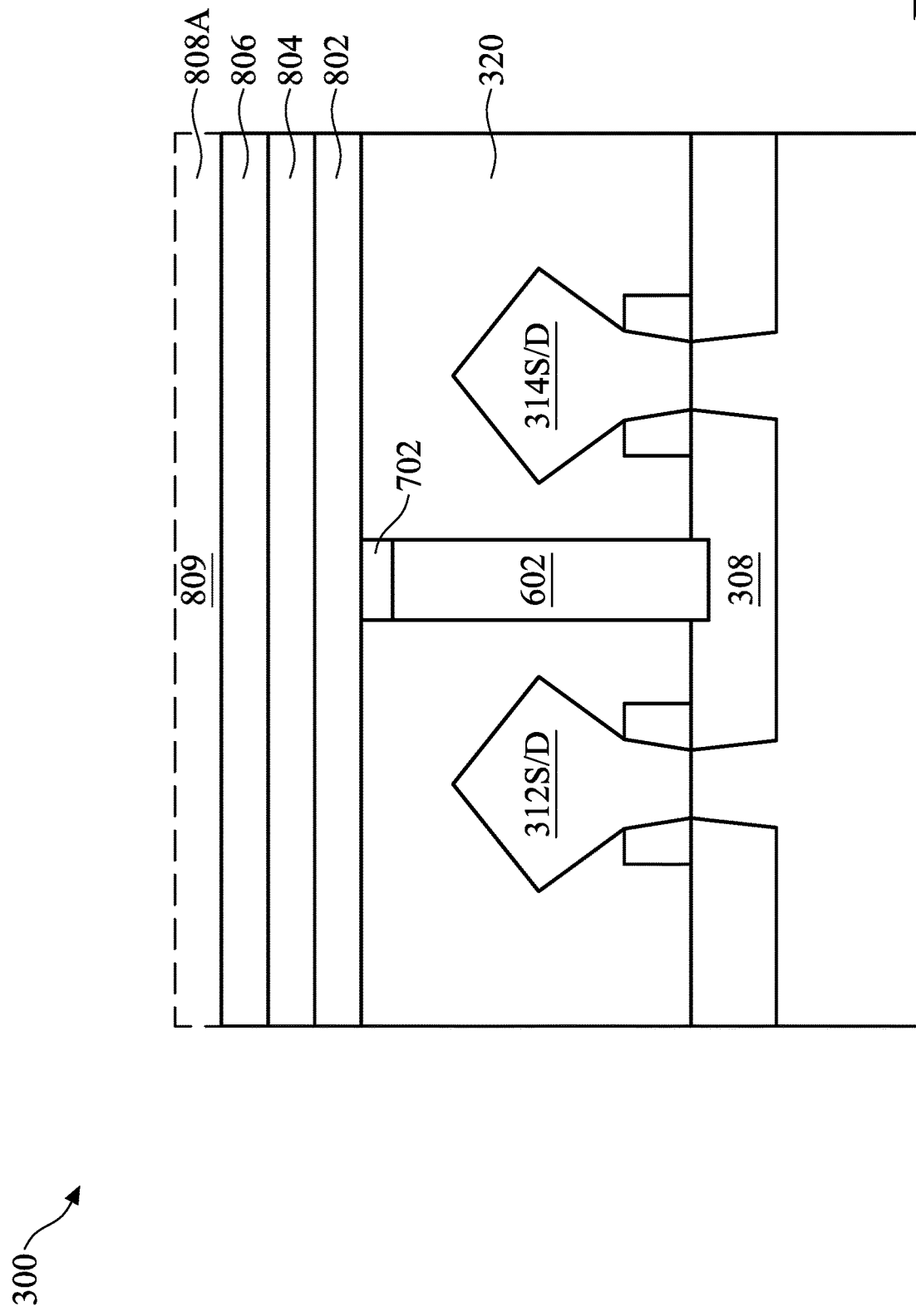
Figure 8D:
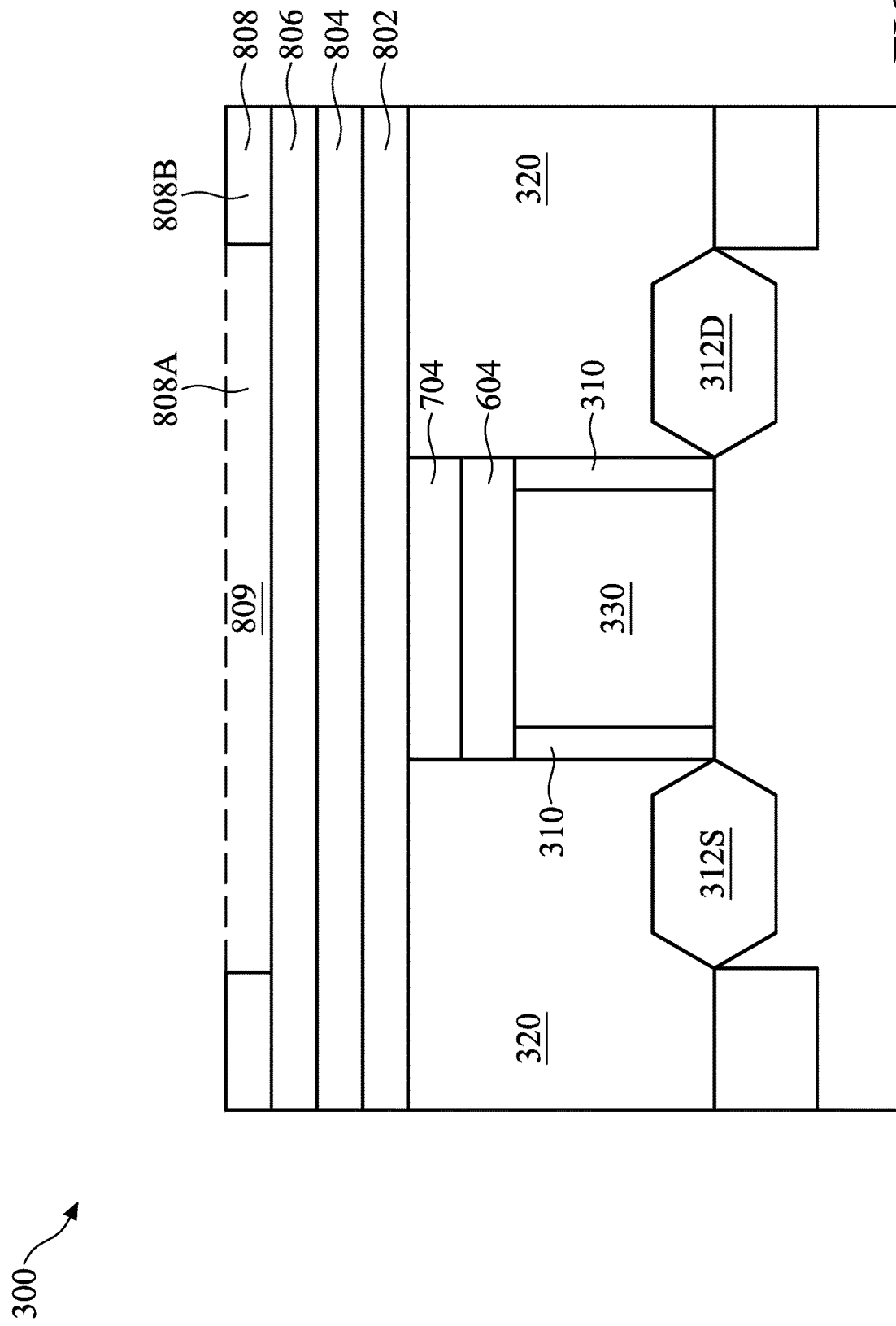
Figure 8E:
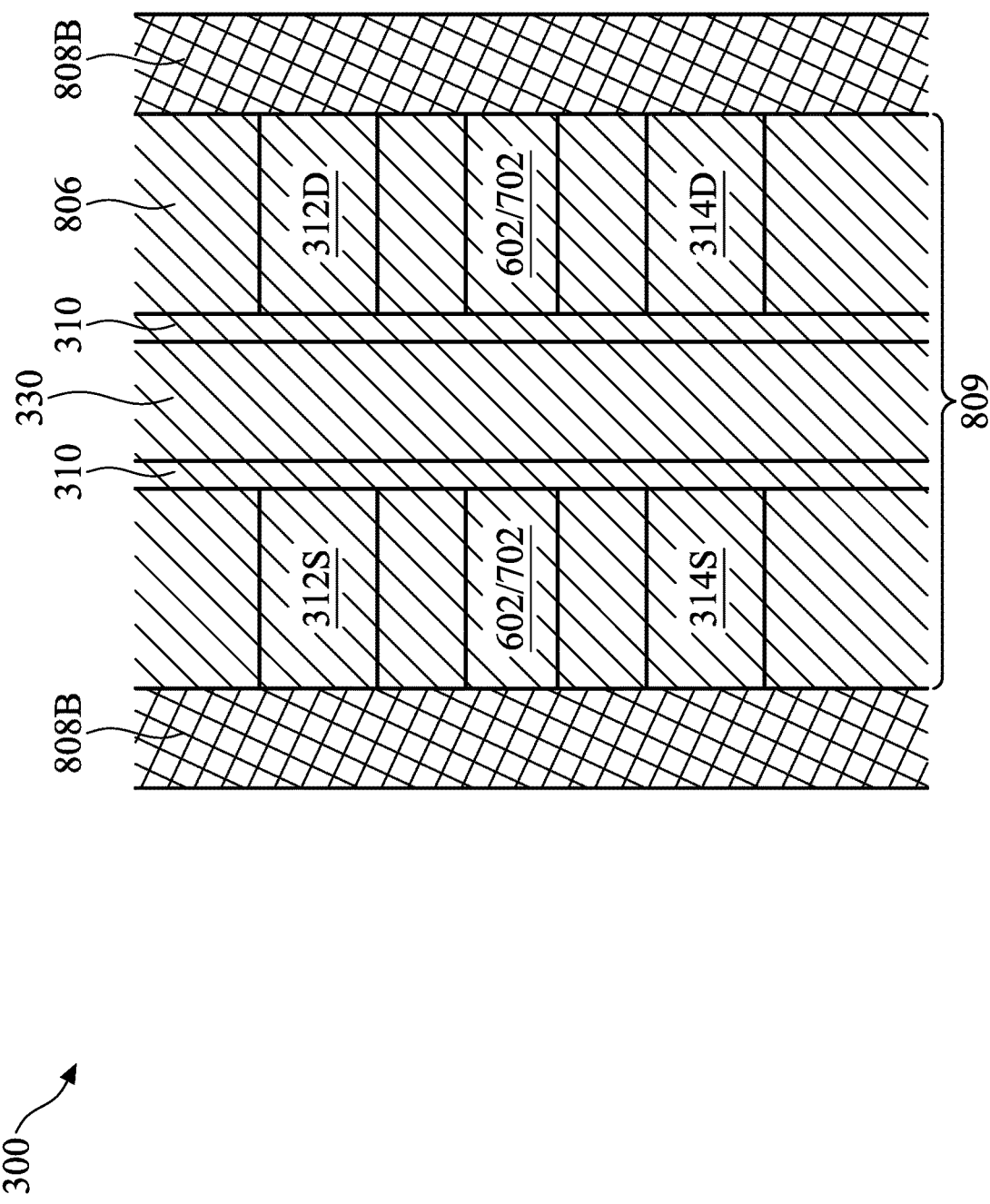
FIG. 8E illustrates a top view of the example FinFET corresponding to FIGS. 8A-D, in accordance with some embodiments.

Corresponding to operation 212 of FIG. 2, FIG. 8A is a cross-sectional view of the FinFET device 300, cut along cross-section B-B (as indicated in FIG. 1), that includes a hard mask layer 802 and one or more imaging (or patternable) layers 804 and 806 at one of the various stages of fabrication. FIGS. 8B and 8C are respective cross-sectional views of the FinFET device 300, cut along cross-section B-B, in which the isolation structure 602 is configured in other embodiments. The hard mask layer 802 and imaging layers 804-806 shown in FIGS. 8A-C are formed over the FinFET device 300 shown in FIGS. 7A-C, respectively. FIG. 8D illustrates a corresponding cross-sectional view of one of FIGS. 8A-C, cut along cross-section A-A (as indicated in FIG. 1), that includes another imaging layer 808 formed over the hard mask layer 802 and the imaging layers 804-806. For purposes of illustration, FIG. 8E depicts a corresponding top view of the FinFET device 300 at this stage of fabrication.

The imaging layer can be a photoresist layer (also referred to as a resist layer, photosensitive layer, patterning layer, light sensitive layer, etc.) that is responsive to an exposure process for creating patterns. The imaging layer may be a positive-type or negative-type resist material and may have a multi-layer structure. One example resist material is a chemical amplifier (CA) resist. In the present example (which can be better illustrated in FIG. 8D), a tri-layer resist patterning scheme is utilized. Thus, the imaging layer includes three imaging layers: bottom layer 804, middle layer 806, and upper layer 808. The bottom layer 804 is formed over the hard mask layer 802, the middle layer 806 is formed over the bottom layer 804, and the upper layer 808 is formed over the middle layer 804. It is understood that other patterning layer schemes, such as a single imaging layer, may be used while remaining within the scope of the present disclosure.

The hard mask layer 802 is formed over the ILD 320 by any suitable process. The hard mask layer 802 includes Si, WC, TiN, TaN, metal oxide, or combinations thereof. The hard mask layer 802 has a thickness of approximately 100~300 angstroms, for example.

The bottom, middle, and upper layers 804-808 can include any suitable material. For example, the layers 804-808 may include various organic and/or inorganic materials. In one example, the bottom layer 804 may include an organic layer, the middle layer 806 may include an inorganic layer, and the upper layer 808 may include an organic layer. The bottom organic layer 804 may include a photoresist material, an anti-reflective coating (ARC) material, a polymer material, and/or other suitable materials. The middle inorganic layer 806 may include an oxide layer, such as a low temperature CVD oxide, an oxide derived from TEOS (tetraethylorthosilicate), silicon oxide, or silane oxide. Another example includes the middle layer 806 as a Si-containing anti-reflective coating (ARC) material, such as a 42% Si-containing ARC layer. The upper organic layer 808 may comprise an organic photoresist material. Further, the imaging layers 804-808 can have any suitable thickness. In one non-limiting example, the bottom layer 804 has a thickness of approximately 2000 angstroms, the middle layer 806 has a thickness of approximately 480 angstroms, and the upper layer 808 has a thickness of approximately 750 angstroms.

Utilizing the tri-layer patterning technique, the upper, photoresist layer 808 is first patterned by a photolithography process and/or processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the upper layer 808 while protecting one or more other portions of the upper layer 808, for example, 808A being unexposed and 808B being exposed, or 808A being exposed and 808B being unexposed.

In an example where the upper layer 808 includes a negative resist material, the exposed portions (e.g., 808B) may become insoluble upon exposure, while the unexposed portions (e.g., 808A) remain soluble. In another example where the upper layer 808 includes a positive resist material, the exposed portions (e.g., 808A) may become soluble upon exposure, while the unexposed portions (e.g., 808B) remain insoluble. The patterning of the photoresist layer 808 can use one or more masks to form the one or more exposed and unexposed portions 808A-B. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Next, portions of the upper layer 808 are removed to form an opening 809. In the foregoing example where the upper layer 808 includes negative resist material, the unexposed portion 808A of the upper layer 808 is removed to form the opening 809 in the upper layer 808, as shown in FIGS. 8A-D. The unexposed portion 808A can be removed by any suitable process. The resulting upper layer 808, with the opening 809, can define contact holes for source/drain structures 312S/D and 314S/D, which will be discussed in detail below. It is noted that along the cross-section B-B (FIGS. 8A-C), the portion of the upper layer 808 over the source/drain structures 312S/D and source/drain structures 314S/D may be the unexposed portions 808A, e.g., becoming soluble. As such, upon the removal of the unexposed portions 808A, along the cross-section B-B, the middle layer 806 may be completely exposed by the opening 809, when compared to FIG. 8D (along the cross-section A-A) where the middle layer 806 is partially exposed by the opening 809.

FIG. 8E illustrates an example top view of the FinFET device 300 at this fabrication stage. As shown, the opening 809 may be formed as a stripe between the resulting upper layer 808 (e.g., 808B) exposing a portion of the middle layer 806 that overlays the active gate structure 330, the source/drain structures 312S/D and 314S/D, and the isolation structures 602 (overlaid by the respective sacrificial helmet structures 703). Although the present example of FIG. 8E includes the isolation structure 602 disposed between each of the source/drain structures 312S and 314S and the source/drain structures 312D and 314D, it is note that the isolation structure 602 may be disposed between either the source/drain structures 312S and 314S or the source/drain structures 312D and 314D while remaining within the scope of the present disclosure.

Figure 9A:
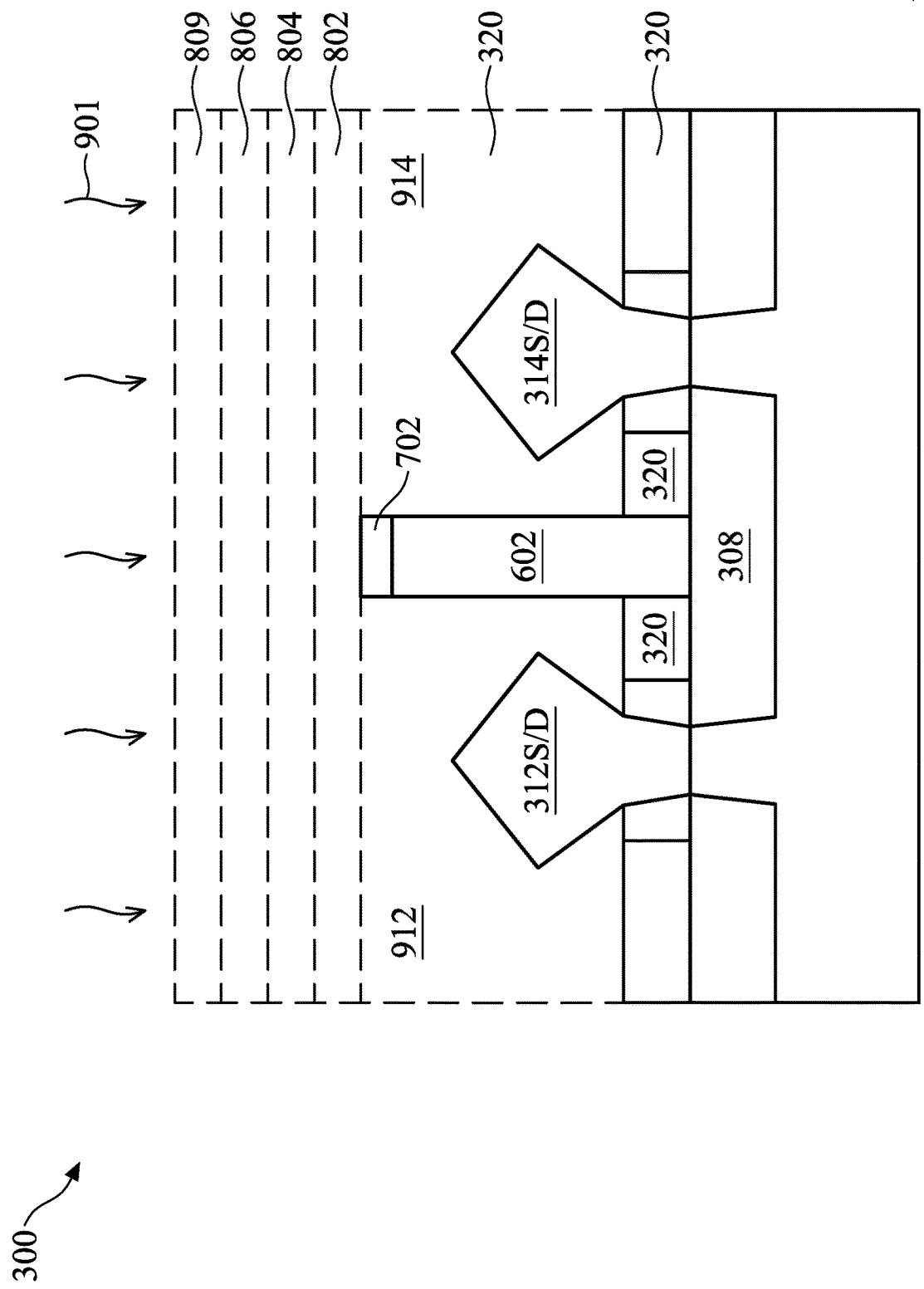
Figure 9B:
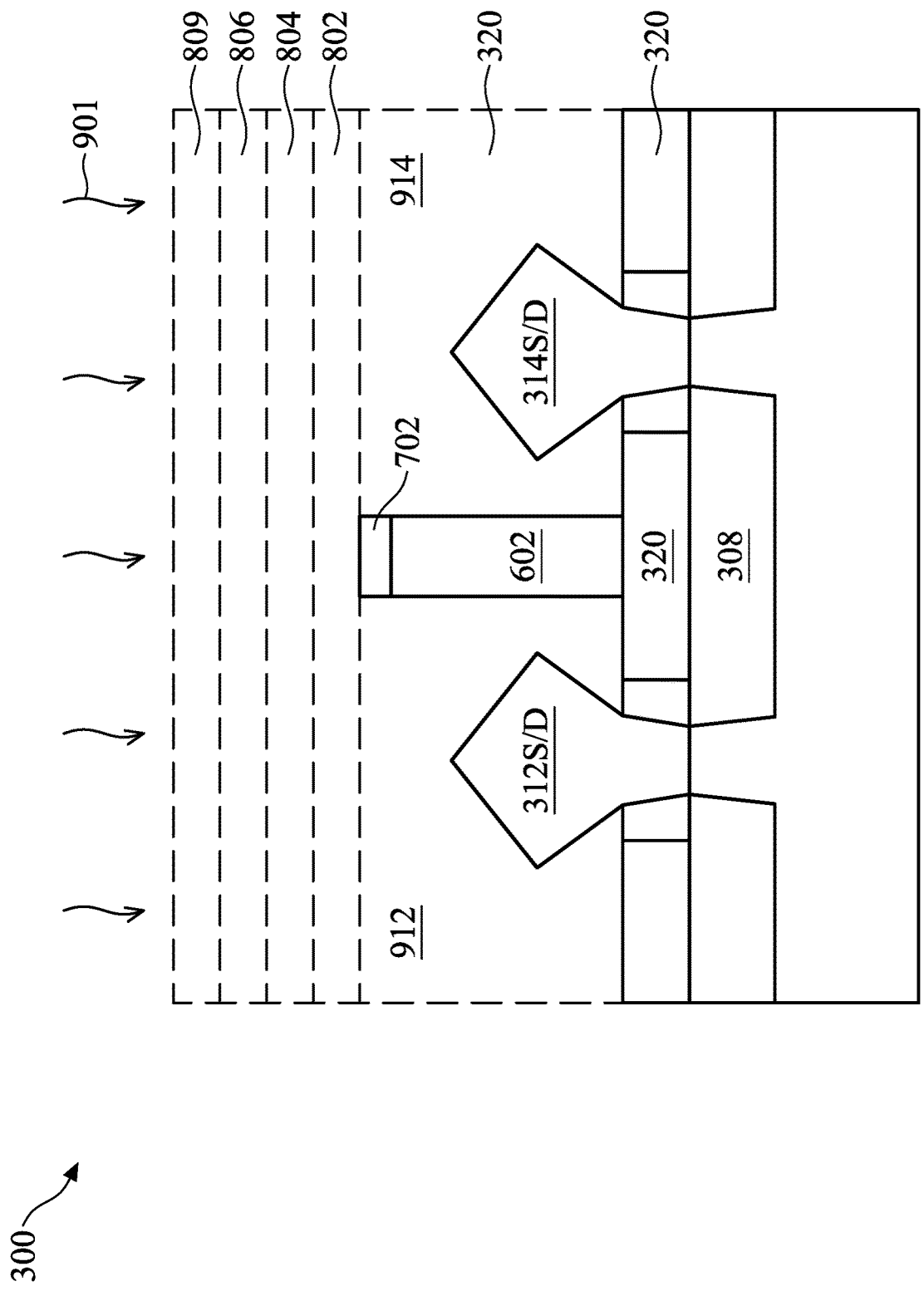
Figure 9C:
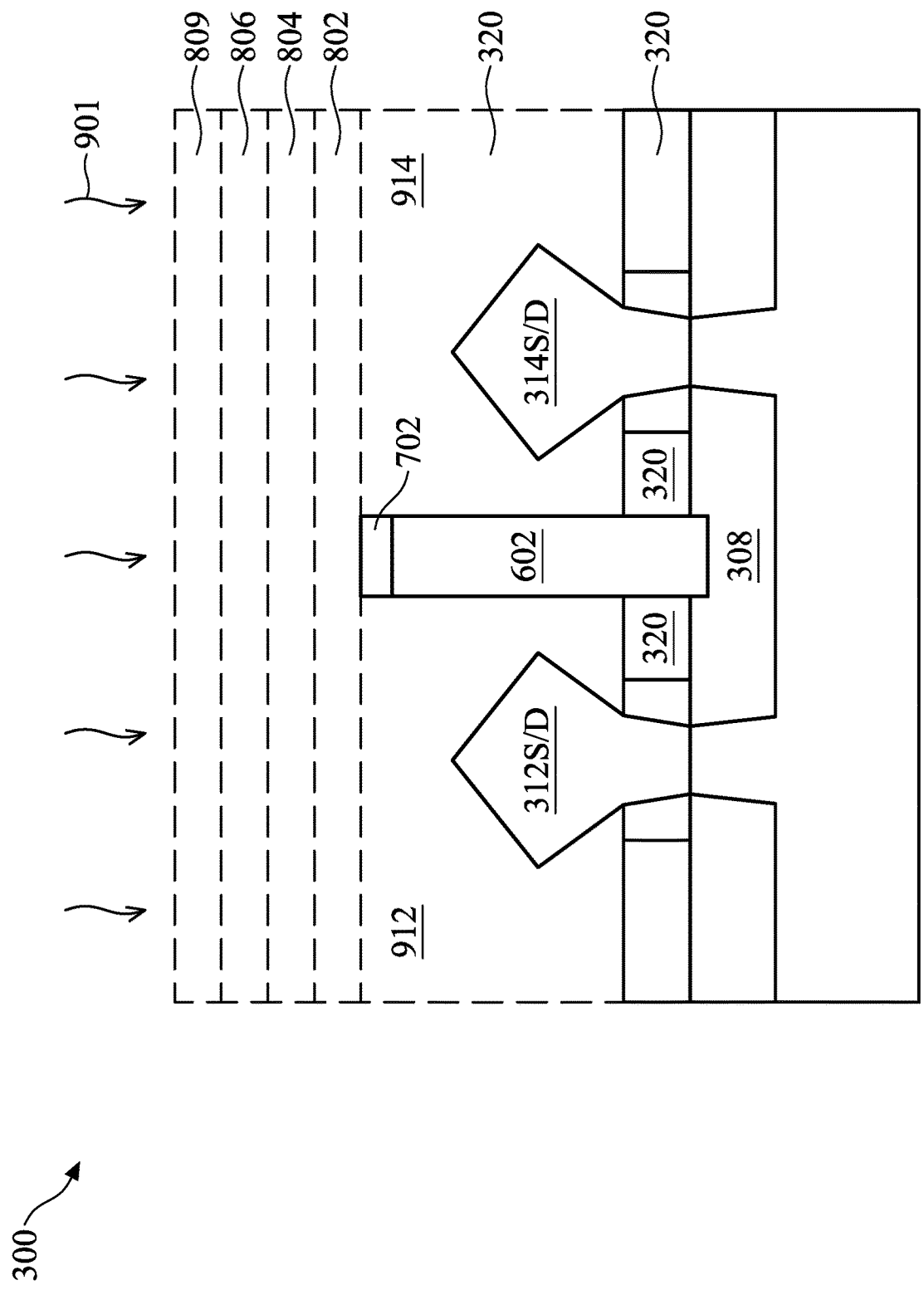
Figure 9D:
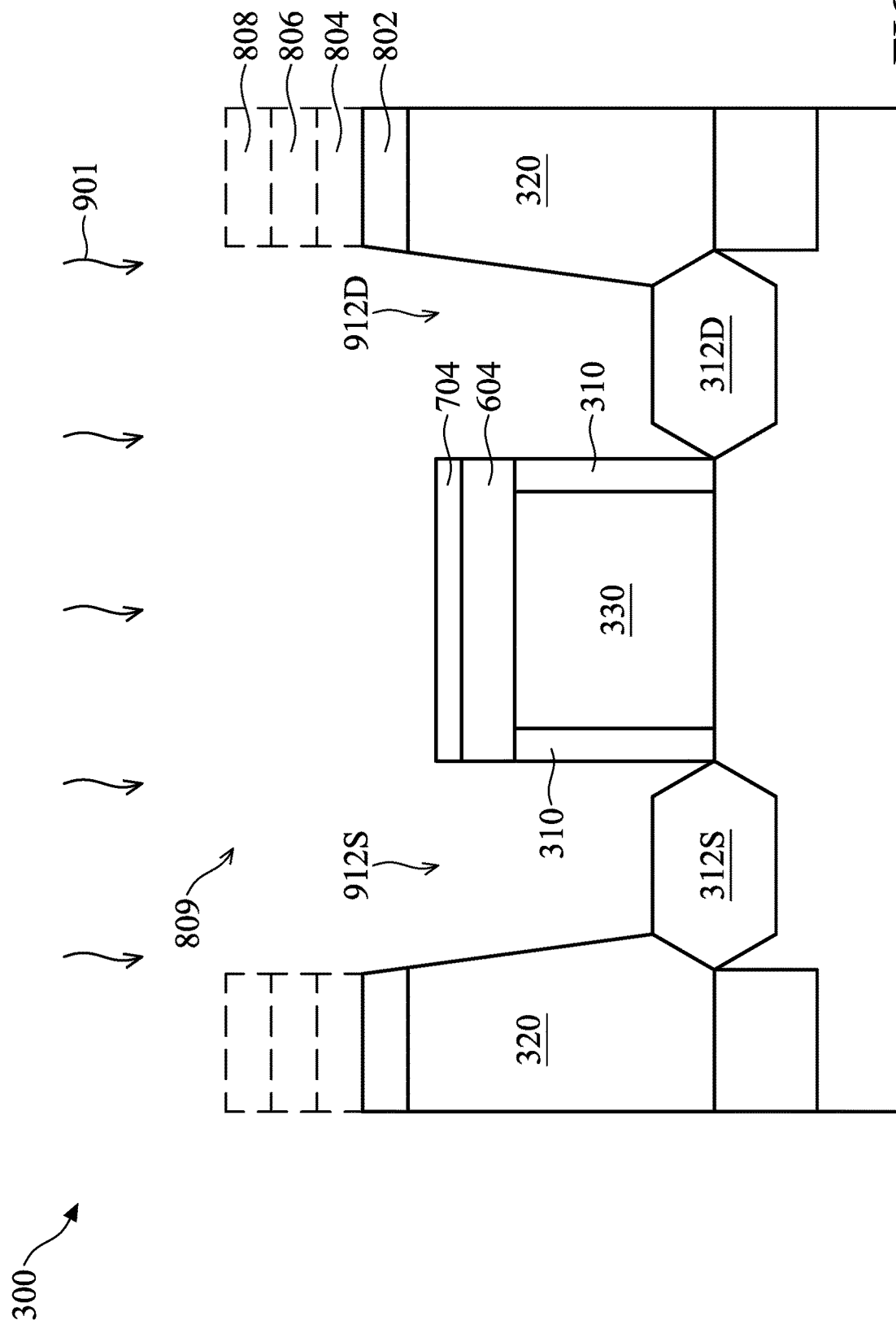

Corresponding to operation 214 of FIG. 2, FIG. 9A is a cross-sectional view of the FinFET device 300, cut along cross-section B-B (as indicated in FIG. 1), that includes contact holes 912 and 914 at one of the various stages of fabrication. FIGS. 9B and 9C are respective cross-sectional views of the FinFET device 300, cut along cross-section B-B, in which the isolation structure 602 is configured in other embodiments. The contact holes 912-914 shown in FIGS. 9A-C are formed to expose the source/drain structures 312S/D and 314S/D shown in FIGS. 8A-C, respectively. FIG. 9D illustrates a corresponding cross-sectional view of one of FIGS. 9A-C, cut along cross-section A-A (as indicated in FIG. 1), in which the contact hole 912 includes portions 912S and 912D that expose source/drain structures 312S and 312D, respectively.

Upon forming the opening 809, a pattern of the upper layer 808 (e.g., the opening 809) is then transferred to the underlying layers. For example in FIG. 9D, the opening 809 is transferred to the middle layer 806, to the bottom layer 802, and to the hard mask layer 802 via one or more etching process, including various dry etching, wet etching, and/or other etching methods (e.g., reactive ion etching). Subsequently, the remaining upper, middle, and bottom layers 804-808 are removed by any suitable process, including a photoresist stripping process. It is understood that the upper layer, middle layer, and bottom layer 804-808 may be simultaneously or independently removed. For example, while transferring the opening 809 from the upper layer 808 to the middle layer 806, the upper layer 808 may be simultaneously removed; while transferring the opening in the middle layer 806 to the bottom layer 804, the middle layer 806 may be simultaneously removed; and while transferring the opening in the bottom layer 804 to the hard mask layer 802, the bottom layer 804 may be simultaneously removed. For example in FIGS. 9A-C, as the opening 809 extends across the middle layer 806, after transferring the opening 809 to the hard mask layer 802, the hard mask layer 802 may be completely removed (along the cross-section B-B), thereby exposing portions of the ILD 320 that respectively overlay the source/drains structures 312S/D and 314S/D, with the isolation structure 602 (covered by the sacrificial helmet structure 702) disposed therebetween.

Using the remaining hard mask layer 802 (if any), as a protective mask, respective portions of the ILD 320 are removed via an etching process 901 so as to form the contact holes 912 and 914. It is noted that along the cross-section B-B (FIGS. 9A-C), there is no remaining hard mask layer 802. Thus, the portion of the ILD 320 that respectively overlays the source/drains structures 312S/D and 314S/D is removed to form the contact holes 912 and 914. On the other hand, it is noted that along the cross-section A-A (FIG. 9D), the remaining hard mask layer 802 exposes the portion of the ILD 320 that is vertically aligned with the source/drain structures 312S and 312D. Thus, the portion of the ILD 320 is removed to form the contact holes 912S and 912D that are on opposite sides of the active gate structure 330.

While performing the etching process 901 to remove the portions of the ILD 320, the anti-etching material of the sacrificial helmet structures 702 and 704 may protect the isolation structures 602 and 604, respectively, against the etchants of the etching process 901. Thus, the isolation structures 602 and 604 may remain substantially intact during the etching process 901. The etching process 901 may stop at the above-mentioned contact etch stop layer that overlays the source/drain structures 312S/D and 314S/D. The etching process 901 can include a dry etching process that implements an oxygen-containing gas, fluorine-containing gas (e.g., $CF_4$, $NF_3$, $SF_6$, $CH_2F_2$, $CHF_3$, $C_4F_6$, and/or $C_4F_8$), other suitable gases and/or plasmas, or combinations thereof. After the etching process, the remaining hard mask layer 802 is removed.

Figure 10B:
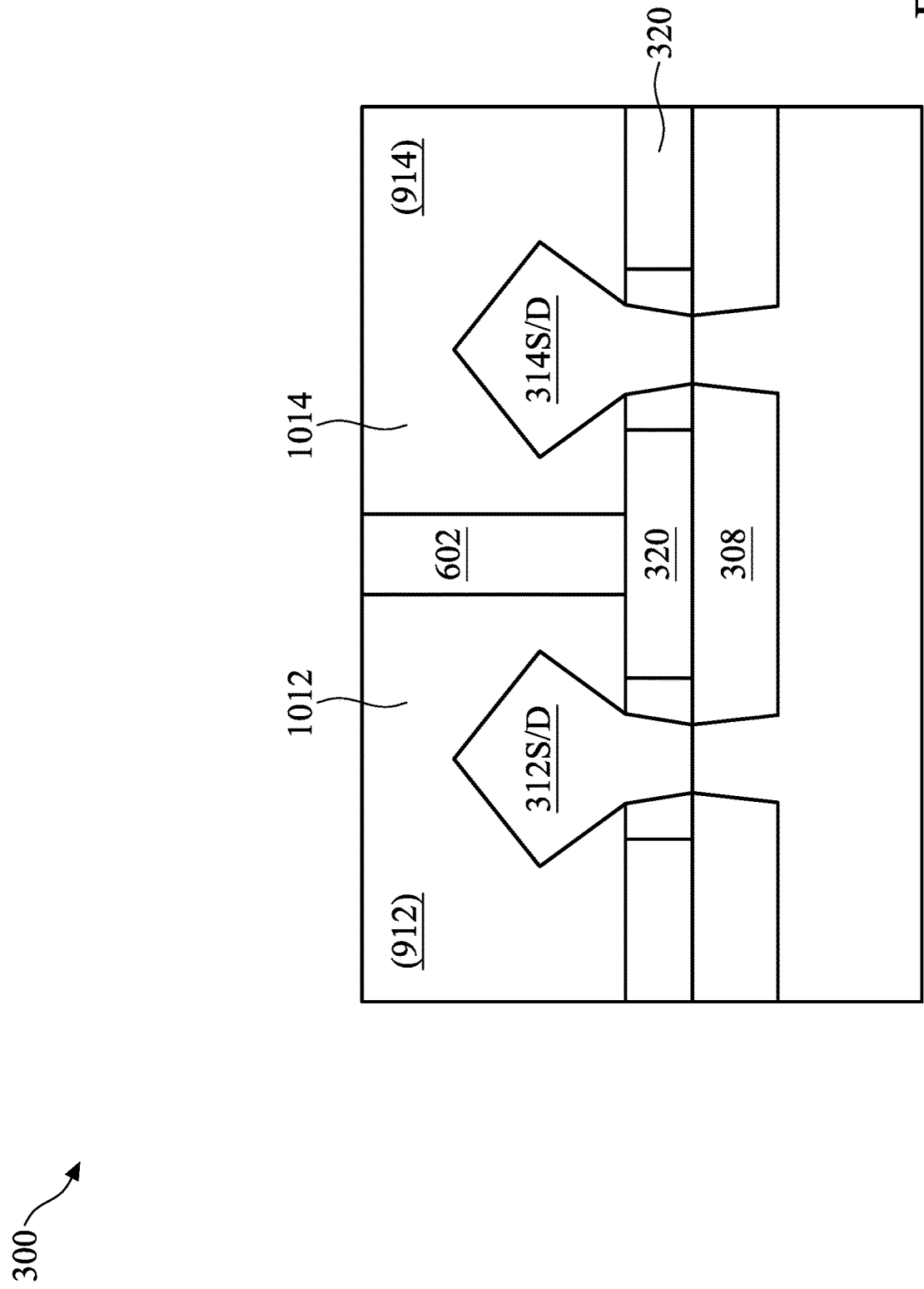
Figure 10C:
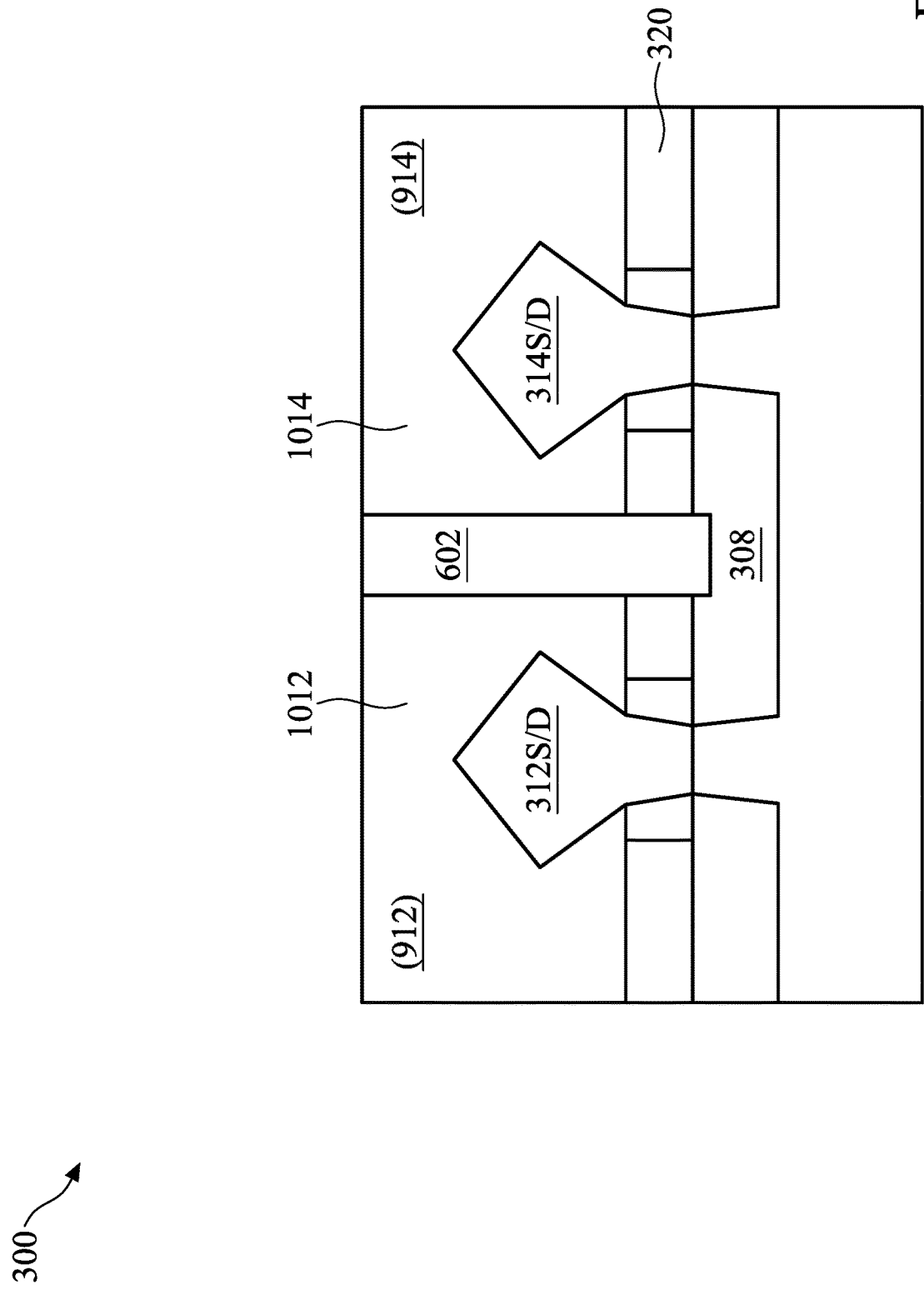
Figure 10D:
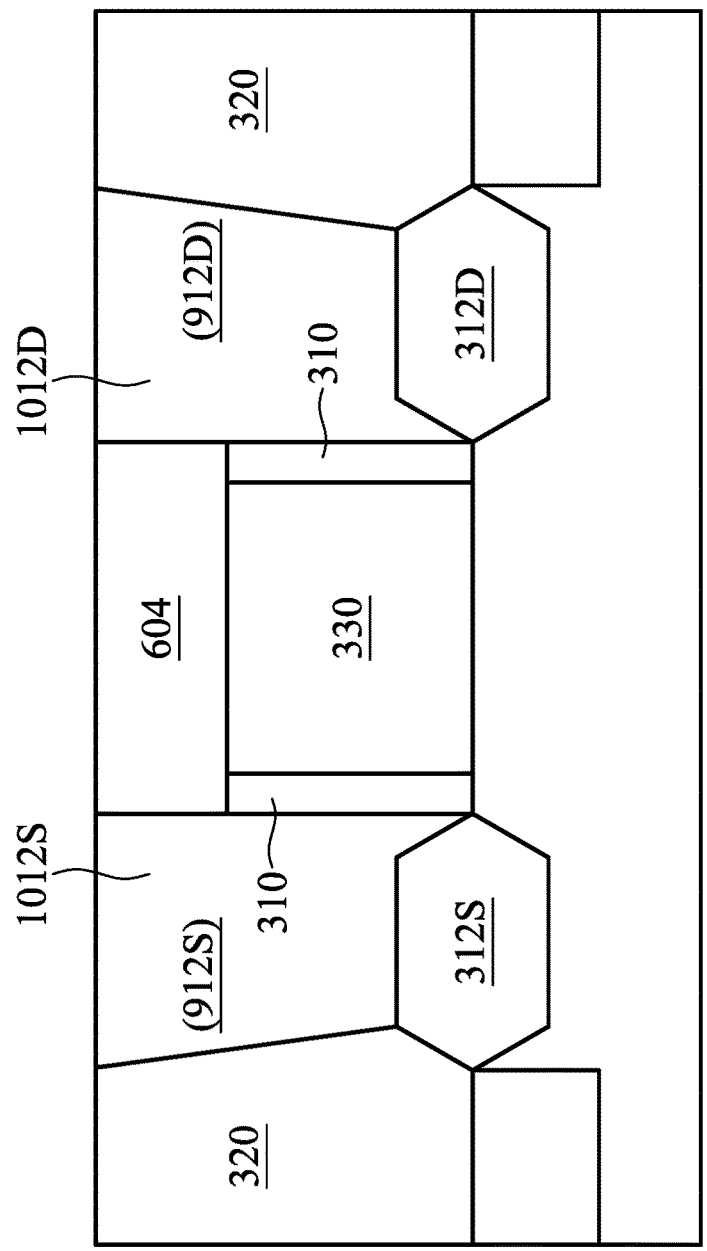

Corresponding to operation 216 of FIG. 2, FIG. 10A is a cross-sectional view of the FinFET device 300, cut along cross-section B-B (as indicated in FIG. 1), that includes interconnect structures 1012 and 1014 at one of the various stages of fabrication. FIGS. 10B and 10C are respective cross-sectional views of the FinFET device 300, cut along cross-section B-B, in which the isolation structure 602 is configured in other embodiments. The interconnect structures 1012-1014 shown in FIGS. 10A-C are formed to electrically connect to the source/drain structures 312S/D and 314S/D shown in FIGS. 9A-C, respectively. FIG. 10D illustrates a corresponding cross-sectional view of one of FIGS. 10A-C, cut along cross-section A-A (as indicated in FIG. 1), in which the interconnect structure 1012 includes portions 1012S and 1012D that electrically connect to the source/drain structures 312S and 312D, respectively.

The interconnect structures 1012 and 1014 may be formed by filling the contact holes 912 and 914 with a meal material, followed by a CMP process to remove the sacrificial helmet structures 702 and 704. The metal material may include tungsten (W), formed by a suitable method, such as PVD, CVD, electroplating, electroless plating, or the like. Besides tungsten, other material materials, such as copper (Cu), gold (Au), cobalt (Co), Ruthenium (Ru), combinations thereof, multi-layers thereof, alloys thereof, or the like, may also be used to form the interconnect structures 1012 and 1014. As shown in FIG. 10A-C, the interconnect structures 1012 and 1014 that are formed to electrically couple to the source/drain structures 312S/D and 314S/D, respectively, may be electrically isolated by the isolation structure 602. As shown in FIG. 10D, the interconnect structure 1012 can further include portions 1012S and 1012D that electrically couple to the source/drain structures 312S and 312D, respectively. Although not shown, the interconnect structure 1014 can further include portions 1014S and 1014D that electrically couple to the source/drain structures 314S and 314D, respectively. In various embodiments, such interconnect structures 1012 and 1014 may be part of a middle-end-of-line (MEOL) interconnection network, where such interconnect structures are sometimes referred to as "MDs."

FIG. 11 illustrates a flowchart of another method 1100 to form interconnect structures for a transistor device, according to one or more embodiments of the present disclosure. For example, at least some of the operations of the method 1100 can be used to form a FinFET device (e.g., FinFET device 1200). It is noted that the method 1100 is merely an example, and is not intended to limit the present disclosure. Accordingly, it is understood that additional operations may be provided before, during, and after the method 1100 of FIG. 11, and that some other operations may only be briefly described herein.

In some embodiments, the method 1100 is substantially similar to the method 200 of FIG. 2 except that the method 1100 further includes operations to form air spacers along sidewalls of an isolation structure. Thus, in the following discussions, operations of the method 1100 may be associated with cross-sectional views of an example FinFET device at various fabrication stages as shown in FIGS. 12A, 12B, 13A, 13B, 14A, 14B, 15A, 15B, 16A, and 16B, respectively, which are only directed to the differences between the methods 200 and 1100.

In brief overview, the method 1100 starts with operation 1102 of providing a partially formed FinFET device. The method 1100 continues to operation 1104 of forming one or more imaging layers that include a pattern for forming an isolation structure. The method 1100 continues to operation 1106 of forming a recess used to form the isolation structure. The method 1100 continues to operation 1108 of forming the isolation structure. The method 1100 continues to operation 1110 of forming one or more sacrificial helmet structures. The method 1100 continues to operation 1112 of forming one or more imaging layers that include a pattern for forming interconnect structures. The method 1100 continues to operation 1114 of forming contact holes used to form the interconnect structures. The method 1100 continues to operation 1116 of forming a sacrificial spacer. The method 1100 continues to operation 1118 of forming an isolation spacer. The method 1100 continues to operation 1120 of forming the interconnect structures. The method 1100 continues to operation 1122 of removing the sacrificial spacer to form an air gap spacer. The method 1100 continues to operation 1124 of sealing the air gap spacer.

It is noted the operations 1102-1114 of FIG. 11 are substantially similar to the operation 202-214 of FIG. 2. Thus, the following discussions will be directed to the operations 1116-1124. FIGS. 16A-16B each illustrate, in a cross-sectional view, a portion of a FinFET device 1200 at various fabrication stages of the method 1100 of FIG. 11. The FinFET device 1200 is substantially similar to the FinFET device 300 shown in FIGS. 3A-10D, but with an air gap spacer that extends along each of the interconnect structures for the source/drain structures. For example, FIGS. 12A, 13A, 14A, 15A, and 16A illustrate cross-sectional views of the FinFET device 1200 along cross-section B-B (as indicated in FIG. 1); and FIGS. 12B, 13B, 14B, 15B, and 16B illustrate cross-sectional views of the FinFET device 300 along cross-section A-A (as indicated in FIG. 1). Although FIGS. 12A-16B illustrate the FinFET device 1200, it is understood the FinFET device 1200 may include a number of other devices such as inductors, fuses, capacitors, coils, etc., which are not shown in FIGS. 12A-16B, for purposes of clarity of illustration.

Figure 12A:
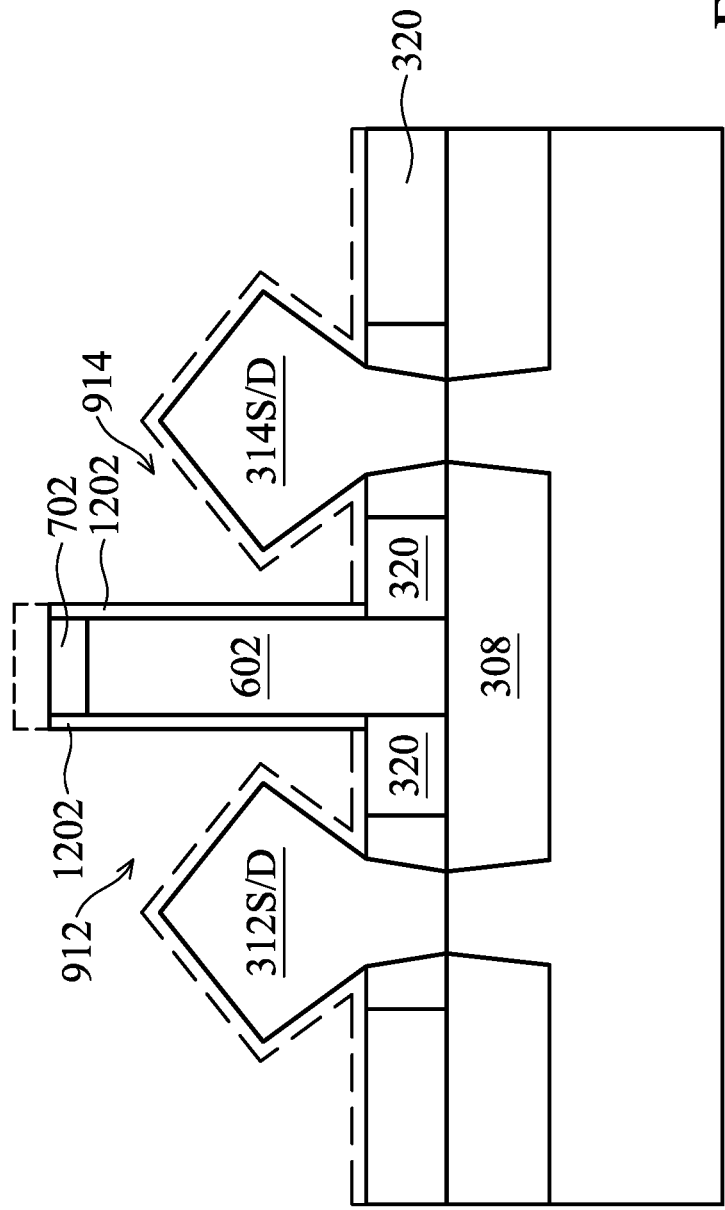
FIGS. 12A, 12B, 13A, 13B, 14A, 14B, 15A, 15B, 16A, and 16B illustrate cross-sectional views of an example FinFET device during various fabrication stages, made by the method of FIG. 11, in accordance with some embodiments.
Figure 12B:
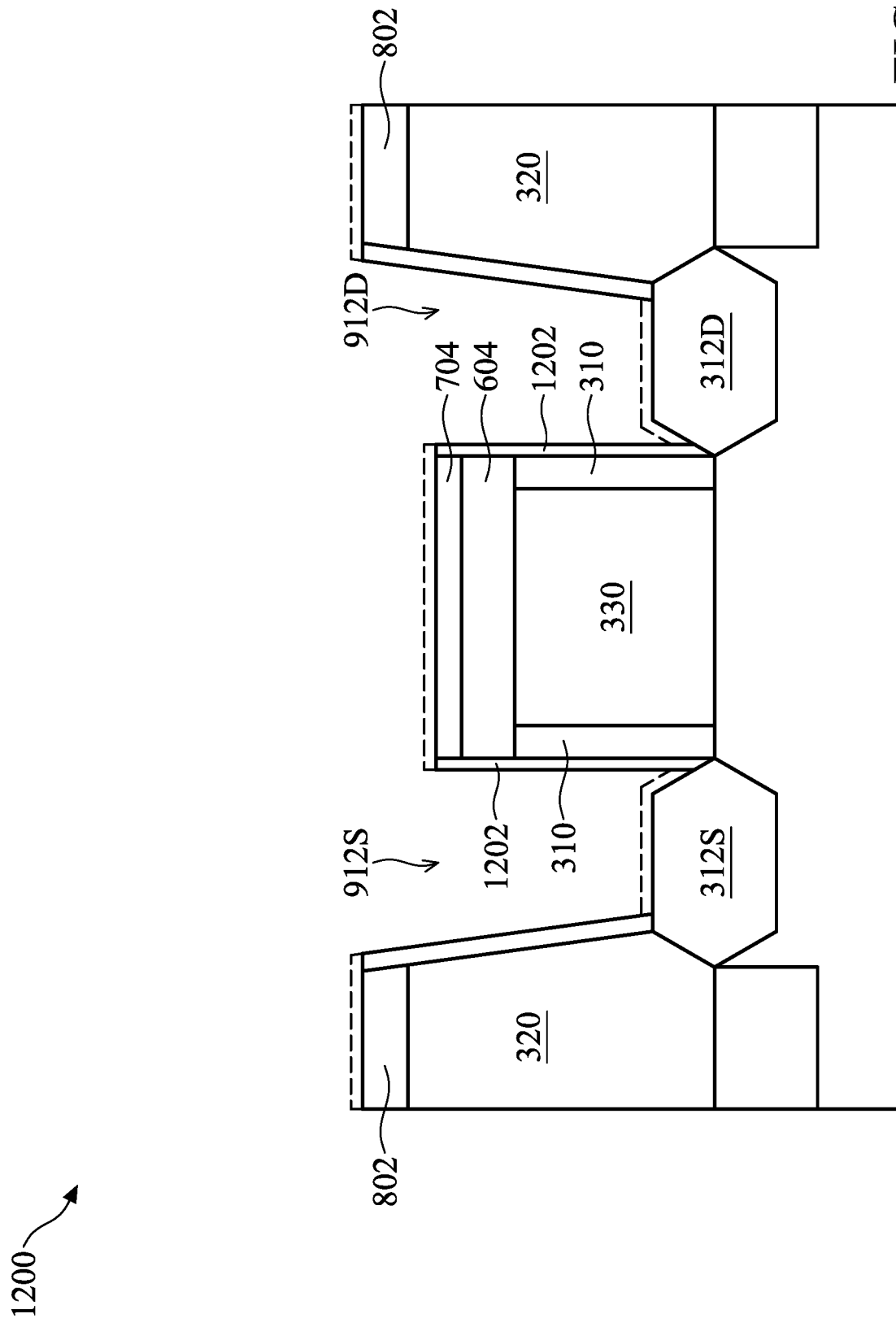

Corresponding to operation 1116 of FIG. 11, FIG. 12A is a cross-sectional view of the FinFET device 1200, cut along cross-section B-B (as indicated in FIG. 1), that includes a sacrificial spacer 1202 at one of the various stages of fabrication. FIG. 12B illustrates a corresponding cross-sectional view of the FinFET device 1200, cut along cross-section A-A (as indicated in FIG. 1).

The sacrificial spacer 1202 shown in FIGS. 12A-B is formed over the FinFET device 1200 that is partially formed through the operations 1102-1114, which are substantially similar to the operations 202-214 of FIG. 2, and thus, the reference numerals used in FIGS. 3A-10D will continue to be used in the following discussions of the operation 1116 (and the operations 1118-1124). Further, in the following discussions of the operations 1116-1124, the embodiment of the isolation structure 602 shown in FIG. 9A (where the bottom surface of the isolation structure 602 is leveled with the top surface of the STI 308) is used as a representative example. Thus, it is understood that the operations 1116-1124 can be applied to other embodiments of the isolation structure 602 (e.g., FIGS. 9B-C) while remaining within the scope of the present disclosure.

The sacrificial spacer 1202 may be first as a conformal layer over the partially formed FinFET device 1200 (e.g., over the contact holes 912 and 914), followed by an etching process to remove portions of the sacrificial spacer 1202 that overlay, for example, the source/drain structures 312S/D and 314S/D, the ILD 320, the sacrificial helmet structures 702 and 704, and the remaining hard mask layer 802, as indicated by dotted lines in FIGS. 12A-B. Consequently, the (remaining) sacrificial spacer 1202 may extend along: (i) sidewalls of the isolation structure 602 and the sacrificial helmet structure 702; (ii) sidewalls of the active gate structure 330, the isolation structure 604, and the sacrificial helmet structure 704; and (iii) sidewalls of the ILD 320 and the remaining hard mask layer 802, as indicated by solid lines in FIGS. 12A-B.

The sacrificial spacer 1202, which may include silicon, may be formed by a suitable formation method such as CVD, PVD, combinations thereof, or the like to have a relatively thin thickness of about 2~10 nm. It should be understood that the sacrificial spacer 1202 can include any of various other materials as long as such a material has a different etching selectivity than the materials of the sacrificial helmet structures 702 and 704 and the isolation structure 602. The etching process can include a dry etching process that implements an oxygen-containing gas, chlorine-containing gas (e.g., $Cl_2$, and/or $BCl_3$), bromine-containing gas (e.g., HBr), other suitable gases and/or plasmas, or combinations thereof.

Figure 13A:
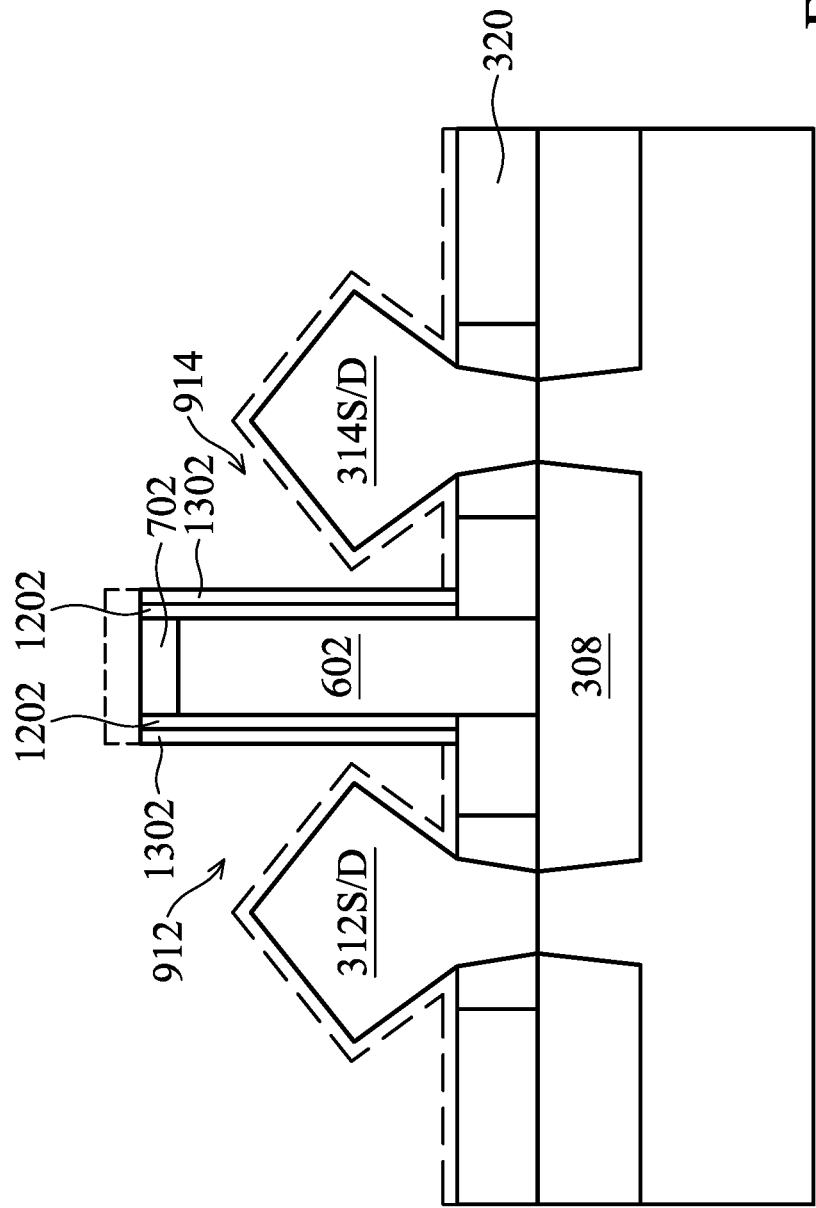
Figure 13B:
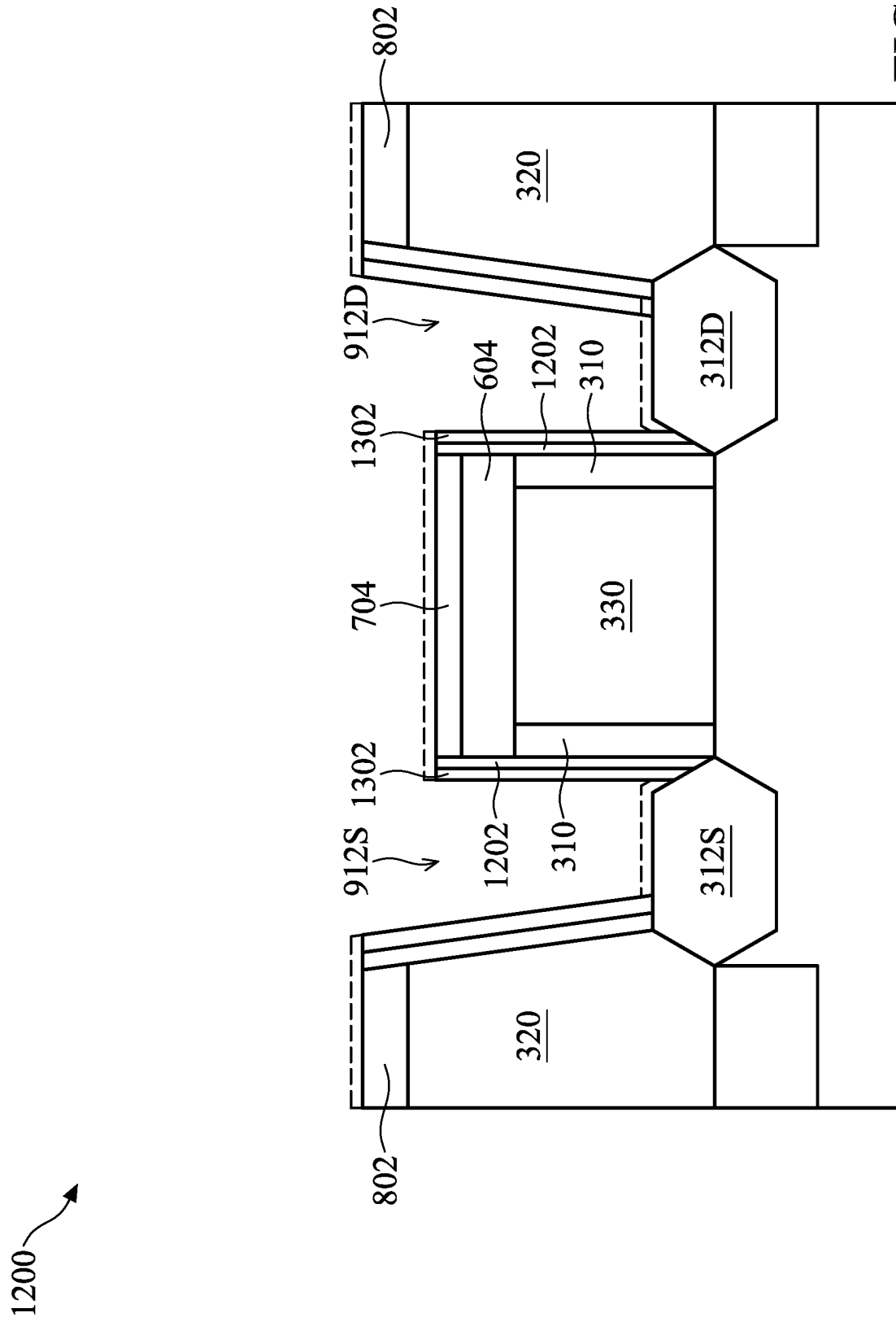

Corresponding to operation 1118 of FIG. 11, FIG. 13A is a cross-sectional view of the FinFET device 1200, cut along cross-section B-B (as indicated in FIG. 1), that includes an isolation spacer 1302 at one of the various stages of fabrication. FIG. 13B illustrates a corresponding cross-sectional view of the FinFET device 1200, cut along cross-section A-A (as indicated in FIG. 1).

The isolation spacer 1302 may be first as a conformal layer over the partially formed FinFET device 1200 (e.g., over the contact holes 912 and 914), followed by an etching process to remove portions of the isolation spacer 1302 that overlay, for example, the source/drain structures 312S/D and 314S/D, the ILD 320, the sacrificial helmet structures 702 and 704, and the remaining hard mask layer 802, as indicated by dotted lines in FIGS. 13A-B. Consequently, the (remaining) isolation spacer 1302 may extend along: (i) sidewalls of the isolation structure 602 and the sacrificial helmet structure 702; (ii) sidewalls of the active gate structure 330, the isolation structure 604, and the sacrificial helmet structure 704; and (iii) sidewalls of the ILD 320 and the remaining hard mask layer 802, with the sacrificial spacer 1202 disposed therebetween, as indicated by solid lines in FIGS. 13A-B.

The isolation spacer 1302, which may include the same material as the isolation structures 602 and 604, may be formed by a suitable formation method such as CVD, PVD, combinations thereof, or the like to have a relatively thin thickness of about 2~10 nm. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$), other suitable gases and/or plasmas, or combinations thereof.

Figure 14A:
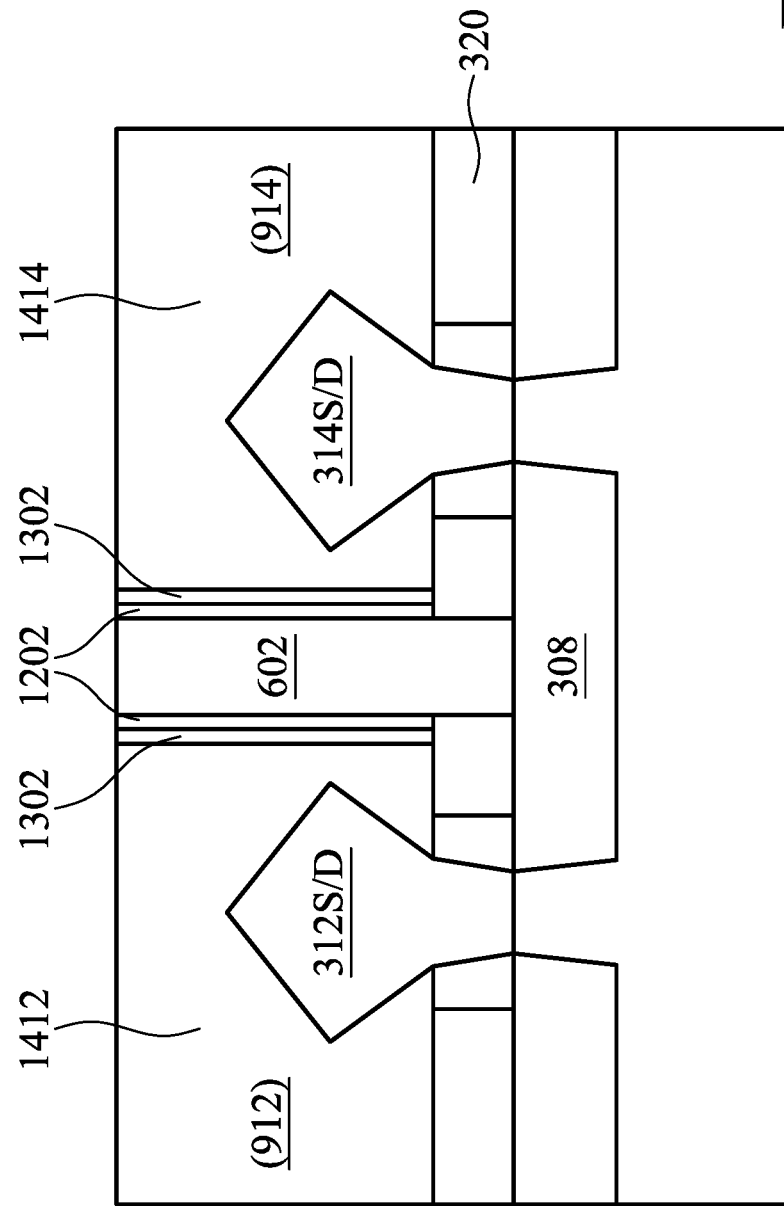
Figure 14B:
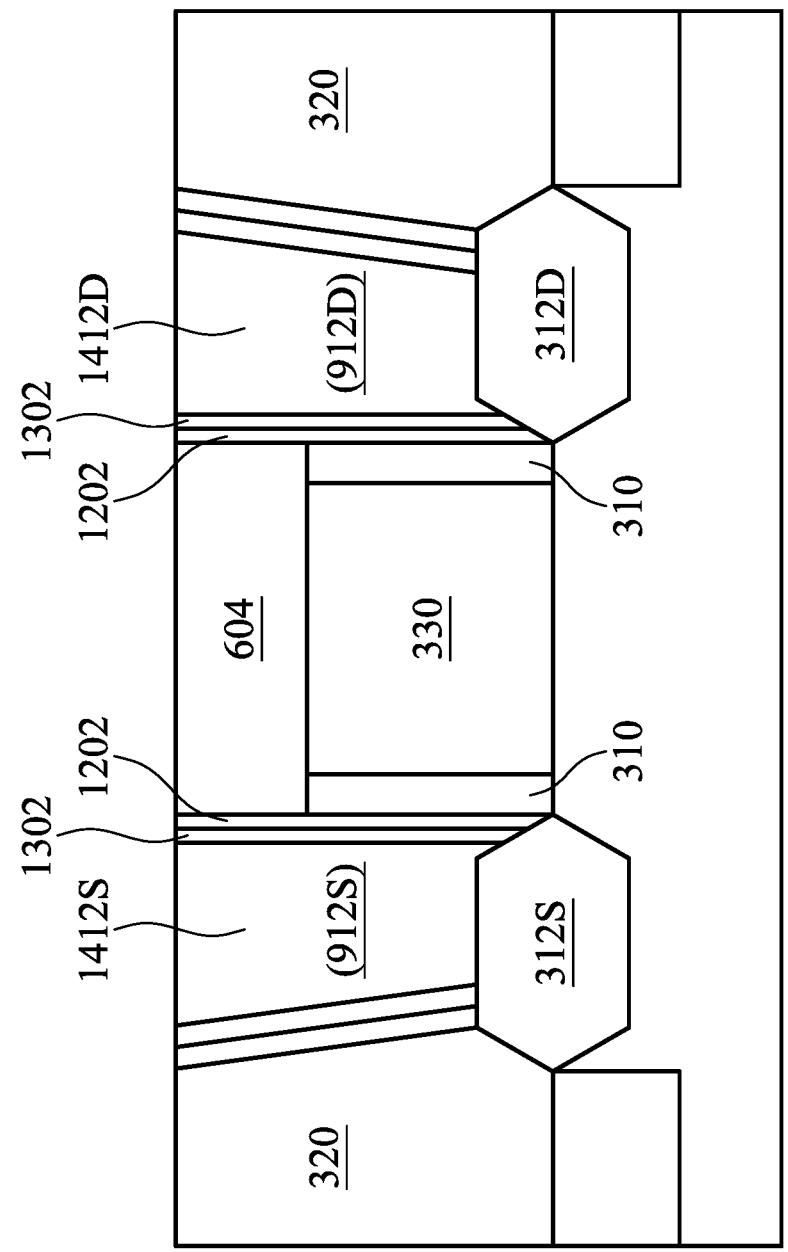

Corresponding to operation 1120 of FIG. 11, FIG. 14A is a cross-sectional view of the FinFET device 1200, cut along cross-section B-B (as indicated in FIG. 1), that includes interconnect structures 1412 and 1414 at one of the various stages of fabrication. FIG. 14B illustrates a corresponding cross-sectional view of the FinFET device 1200, cut along cross-section A-A (as indicated in FIG. 1), in which the interconnect structure 1412 further includes portions 1412S and 1412D that electrically connect to the source/drain structures 312S and 312D, respectively.

The interconnect structures 1412 and 1414 may be formed by filling the contact holes 912 and 914 with a meal material, followed by a CMP process to remove the sacrificial helmet structures 702 and 704. The metal material may include tungsten (W), formed by a suitable method, such as PVD, CVD, electroplating, electroless plating, or the like. Besides tungsten, other material materials, such as copper (Cu), gold (Au), cobalt (Co), Ruthenium (Ru), combinations thereof, multi-layers thereof, alloys thereof, or the like, may also be used to form the interconnect structures 1412 and 1414. As shown in FIG. 14A-B, the interconnect structures 1412 and 1414 that are formed to electrically couple to the source/drain structures 312S/D and 314S/D, respectively, may be electrically isolated by the isolation structure 602. Further, the interconnect structures 1412 and 1414 may be spaced apart from the isolation structure 602 with the sacrificial spacer 1202 and isolation spacer 1302. As shown in FIG. 14B, the interconnect structure 1412 can further include portions 1412S and 1412D that electrically couple to the source/drain structures 312S and 312D, respectively. Although not shown, the interconnect structure 1414 can further include portions 1414S and 1414D that electrically couple to the source/drain structures 314S and 314D, respectively. In various embodiments, such interconnect structures 1412 and 1414 may be part of a middle-end-of-line (MEOL) interconnection network, where such interconnect structures are sometimes referred to as "MDs."

Figure 15A:
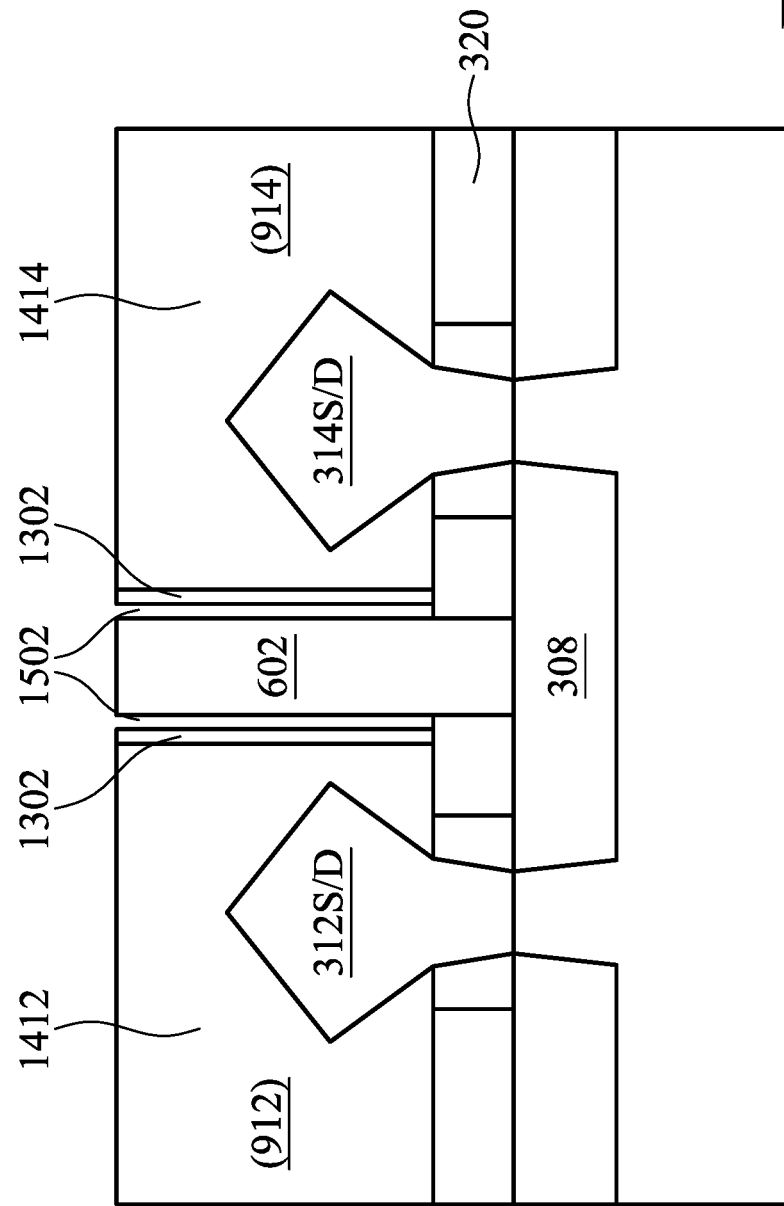
Figure 15B:
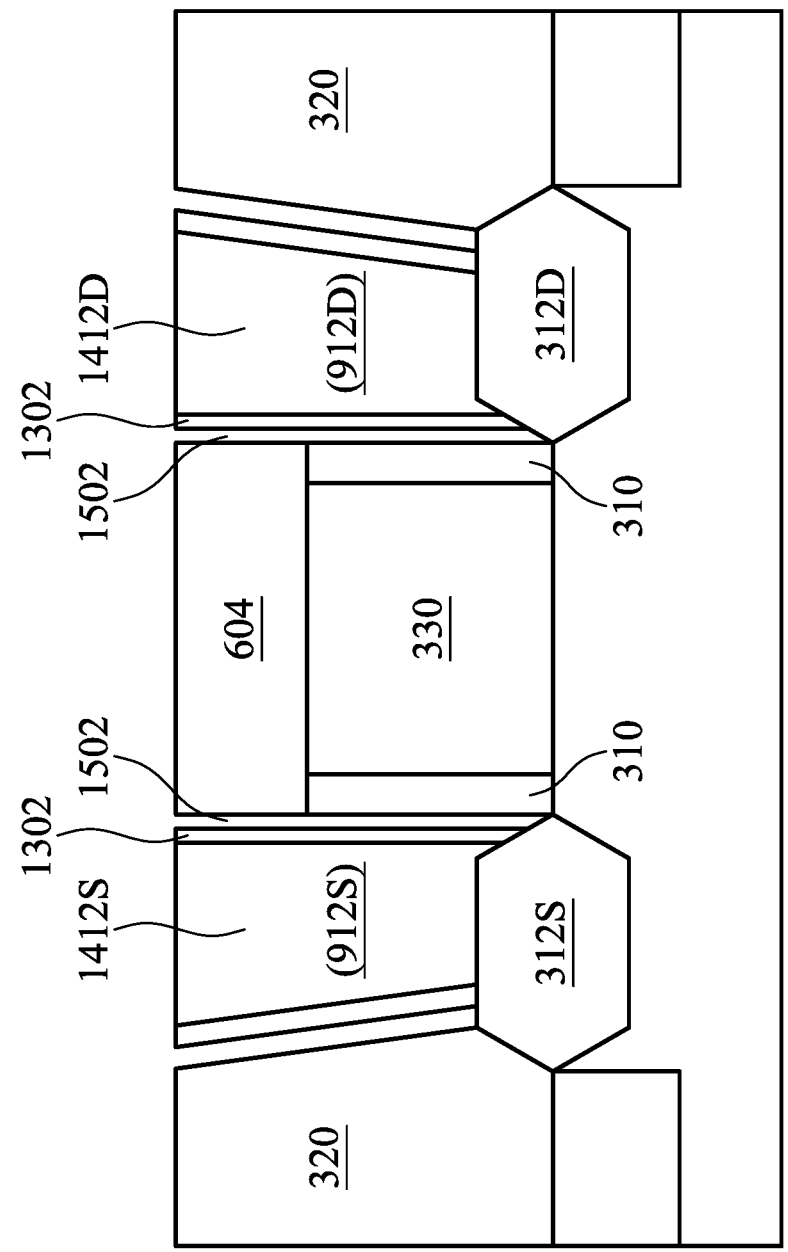
Figure 16A:
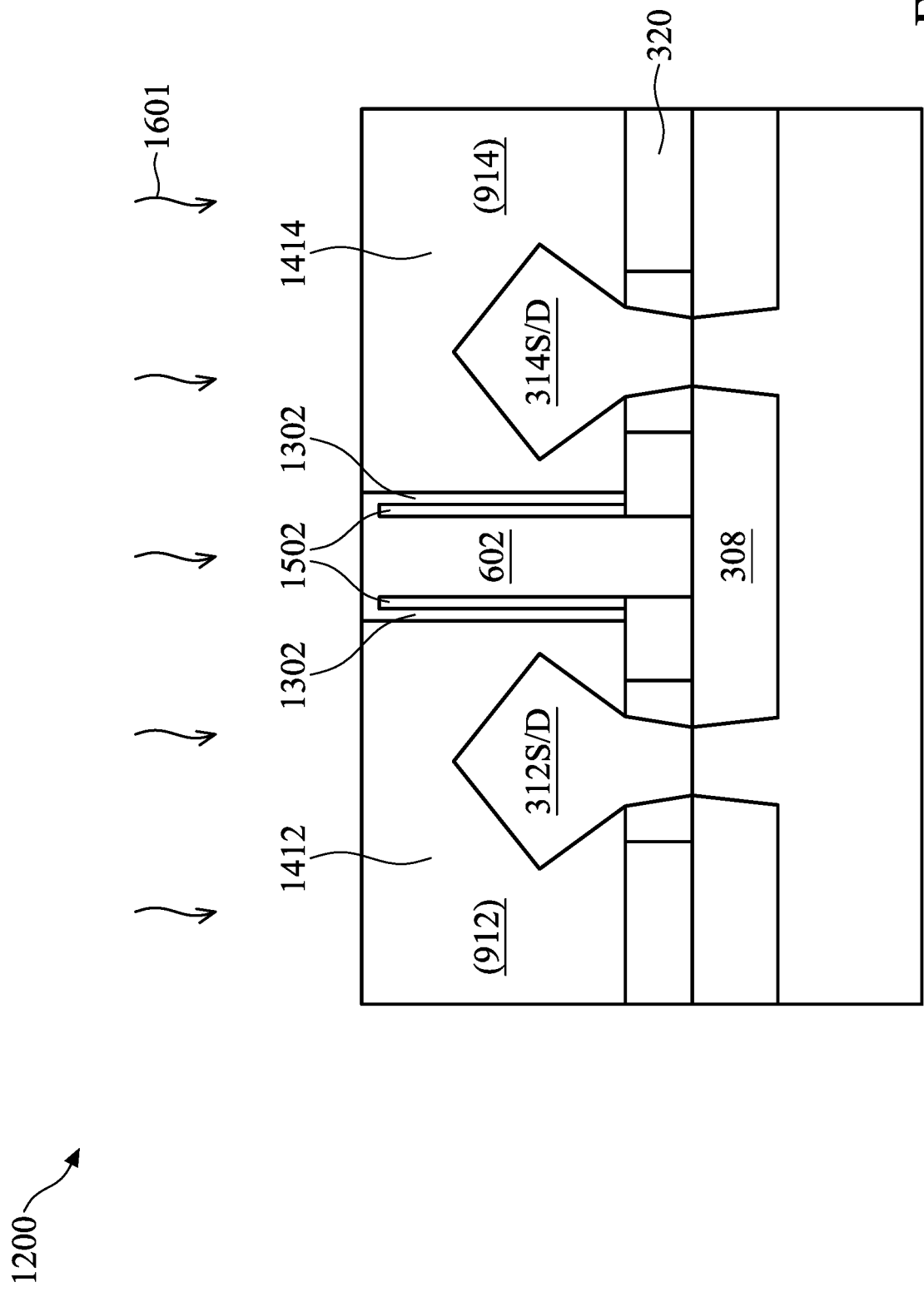
Figure 16B:
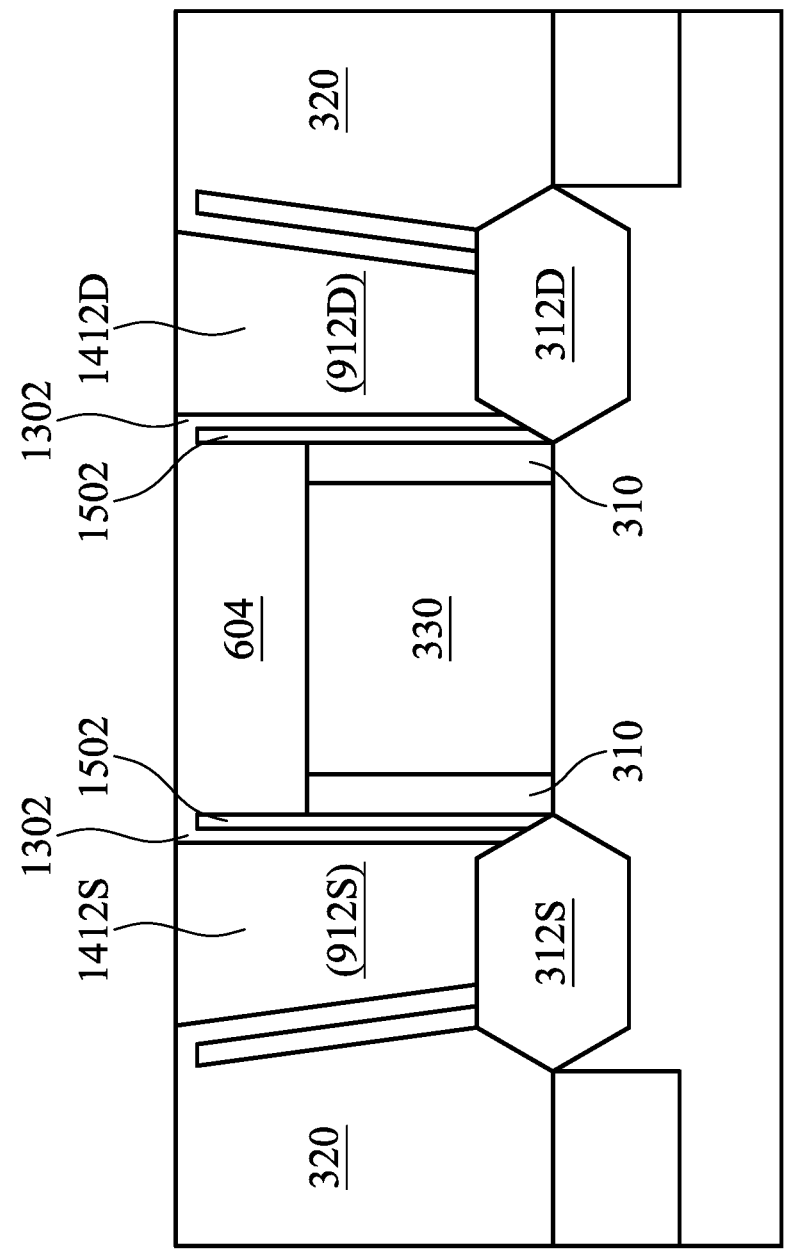

Corresponding to operation 1122 of FIG. 11, FIG. 15A is a cross-sectional view of the FinFET device 1200, cut along cross-section B-B (as indicated in FIG. 1), in which the sacrificial spacer 1202 is removed to form an air gap spacer 1502 at one of the various stages of fabrication. FIG. 15B illustrates a corresponding cross-sectional view of the FinFET device 1200, cut along cross-section A-A (as indicated in FIG. 1).

Upon the removal of the sacrificial spacer 1202, the air gap spacer 1502 can be formed to extend along: (i) the sidewalls of the isolation structure 602; and (ii) the sidewalls of the isolation structure 604 and the active gate structure 330, as illustrated in FIGS. 15A-B. The sacrificial spacer 1202 may be removed by performing a chemical and/or wet etching process that can selectively etch the material of the sacrificial spacer 1202 while remaining the isolation spacer 1302 substantially intact. For example, the sacrificial layer 1202 may be etched at a relatively (e.g., 5 times) higher rate than the isolation spacer 1302. The chemical etching process can include $NF_3/H_2$ gas. The wet etching process can be performed using a chemical comprising a base and an oxidizer, in some embodiments. For example, the chemical used may be ammonium hydroxide ($NH_4OH$) or mixture of ammonium hydroxide ($NH_4OH$) and hydrogen peroxide ($H_2O_2$), where $NH_4OH$ functions as the base and $H_2O_2$ functions as the oxidizer. In some embodiments, a mixing ratio (e.g., volume ratio) between $NH_4OH$ and $H_2O_2$ is between about 1:1 and 1:2000 for the wet etch process. The wet etch process may be performed at a temperature between about 40° C. and about 70° C. for a duration between about 1 minute and about 5 minutes, or else may be ended using an endpoint detection process.

Corresponding to operation 1124 of FIG. 11, FIG. 16A is a cross-sectional view of the FinFET device 1200, cut along cross-section B-B (as indicated in FIG. 1), in which the air gap spacer 1502 is sealed at one of the various stages of fabrication. FIG. 16B illustrates a corresponding cross-sectional view of the FinFET device 1200, cut along cross-section A-A (as indicated in FIG. 1).

The air gap spacer 1502 may be sealed at its top portion by performing a sealing process 1601. In some embodiments, the sealing process 1601 can include performing an implantation process that introduces (e.g., dopes) relatively heavy atoms into the isolation structure 602, the isolation spacer 1302, and/or the ILD 320. For example, germanium (Ge) atoms may be doped into respective upper portions of the isolation structure 602, the isolation spacer 1302, and/or the ILD 320 so as to cause such (doped) upper portions to laterally expand so as to merge with each other. As such, the top portion of the air gap spacer 1502 can be sealed. The implantation process may include doping the heavy atoms into the isolation structure 602, the isolation spacer 1302, and/or the ILD 320 with a tilted degree to cause the doped portions concentrated at the respective upper portions. In other embodiments, the sealing process 1601 can include depositing another dielectric material around the air gap spacer 1502 so as to cap the air gap spacer with such a dielectric material.

In one aspect of the present disclosure, a semiconductor device is disclosed. The semiconductor device includes a first source/drain structure coupled to an end of a first conduction channel that extends along a first direction. The semiconductor device includes a second source/drain structure coupled to an end of a second conduction channel that extends along the first direction. The semiconductor device includes a first interconnect structure extending through an interlayer dielectric and electrically coupled to the first source/drain structure. The semiconductor device includes a second interconnect structure extending through the interlayer dielectric and electrically coupled to the second source/drain structure. The semiconductor device includes a first isolation structure disposed between the first and second source/drain structures and extending into the interlayer dielectric.

In another aspect of the present disclosure, a method for making a semiconductor device is disclosed. The method includes forming a first trench at least partially extending through an interlayer dielectric overlaying a first source/drain structure and a second source/drain structure. The first trench is disposed between the first and second source/drain structures. The method includes filling the first trench with a dielectric material to from a first isolation structure. The method includes forming a first interconnect structure and a second interconnect structure that are electrically coupled to the first source/drain structure and the second source/drain structure, respectively. The first and second interconnect structures are electrically isolated from each other by the first isolation structure.

In yet another aspect of the present disclosure, a method for making a semiconductor device is disclosed. The method includes forming a dielectric isolation structure extending through an interlayer dielectric overlaying a first source/drain structure and a second source/drain structure. The dielectric isolation structure is disposed between the first and second source/drain structures. The method includes overlaying a top surface of the dielectric isolation structure with an anti-etching material. The method includes etching the interlayer dielectric to form contact holes that expose the first and second source/drain structures, respectively, while protecting the dielectric isolation structure with the anti-etching material. The method includes filling the contact holes with a metal material to form a first interconnect structure and a second interconnect structure that are electrically coupled to the first source/drain structure and the second source/drain structure, respectively. The first and second interconnect structures are electrically isolated from each other by the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first source/drain structure coupled to an end of a first conduction channel that extends along a first direction;
   a second source/drain structure coupled to an end of a second conduction channel that extends along the first direction;
   a first interconnect structure extending through an interlayer dielectric and electrically coupled to the first source/drain structure;
   a second interconnect structure extending through the interlayer dielectric and electrically coupled to the second source/drain structure;
   a first isolation structure extending into the interlayer dielectric, disposed between the first and second source/drain structures, and disposed next to a gate structure along the first direction; and
   a second isolation structure below the first and second conduction channels, wherein the second isolation structure include a shallow trench isolation structure.

2. The semiconductor device of claim 1, wherein the first isolation structure has a bottom surface leveled with a top surface of the second isolation structure.

3. The semiconductor device of claim 1, wherein the first isolation structure has a bottom surface above a top surface of the second isolation structure.

4. The semiconductor device of claim 1, wherein the first isolation structure has a bottom surface below a top surface of the second isolation structure.

5. The semiconductor device of claim 1, further comprising an air gap disposed between the first isolation structure and each of the first and second interconnect structures.

6. The semiconductor device of claim 5, wherein the air gap extends along one of sidewalls of the first isolation structure.

7. The semiconductor device of claim 1, further comprising:
   a third isolation structure disposed opposite the first interconnect structure from the first isolation structure and extending into the interlayer dielectric; and
   a fourth isolation structure disposed opposite the second interconnect structure from the first isolation structure and extending into the interlayer dielectric.

8. The semiconductor device of claim 1, further comprising a fifth isolation structure disposed above the gate structure.

9. A semiconductor device, comprising:
   a first source/drain structure coupled to a first conduction channel that extends along a first direction;
   a second source/drain structure coupled to a second conduction channel that also extends along the first direction;
   a first interconnect structure extending through an interlayer dielectric and in contact with the first source/drain structure;
   a second interconnect structure extending through the interlayer dielectric and in contact with the second source/drain structure;
   a gate structure extending along a second direction perpendicular to the first direction and overlaying the first and second conduction channels;
   a first isolation structure extending into the interlayer dielectric, disposed between the first and second source/drain structures, and disposed next to the gate structure along the first direction;
   a second isolation structure overlaying at least a portion of the gate structure; and a third isolation structure below the first and second conduction channels, wherein the first isolation structure has a bottom surface below a top surface of the third isolation structure.

10. The semiconductor device of claim 9, wherein a top surface of the first isolation structure and a top surface of the second isolation structure are coplanar with each other.

11. The semiconductor device of claim 9, wherein the first isolation structure has a bottom surface leveled with a top surface of the third isolation structure.

12. The semiconductor device of claim 9, wherein the first isolation structure has a bottom surface above a top surface of the third isolation structure.

13. The semiconductor device of claim 9, wherein the third isolation structure include a shallow trench isolation structure.

14. The semiconductor device of claim 9, further comprising an air gap disposed between the first isolation structure and each of the first and second interconnect structures.

15. A semiconductor device, comprising:
- a first source/drain structure coupled to a first conduction channel that extends along a first direction;
- a second source/drain structure coupled to a second conduction channel that also extends along the first direction;
- a first interconnect structure extending through an interlayer dielectric and in contact with the first source/drain structure;
- a second interconnect structure extending through the interlayer dielectric and in contact with the second source/drain structure;
- a gate structure extending along a second direction perpendicular to the first direction and overlaying the first and second conduction channels;
- a first isolation structure extending into the interlayer dielectric, disposed between the first and second source/drain structures, and disposed next to the gate structure along the first direction;
- a second isolation structure overlaying at least a portion of the gate structure; and
- a third isolation structure below the first and the second conduction channels, wherein the third isolation structure includes a shallow isolation structure, and
- wherein top surface of the first isolation structure and a top surface of the second isolation structure are coplanar with each other.

16. The semiconductor device of claim 15, further comprising an air gap disposed between the first isolation structure and each of the first and second interconnect structures.

17. The semiconductor device of claim 16, wherein the air gap extends along one of sidewalls of the first isolation structure.

18. The semiconductor device of claim 15, wherein the first isolation structure has a bottom surface leveled with a top surface of the third isolation structure.

19. The semiconductor device of claim 15, wherein the first isolation structure has a bottom surface above a top surface of the third isolation structure.

20. The semiconductor device of claim 15, wherein the first isolation structure has a bottom surface below a top surface of the third isolation structure.

* * * * *